(12) United States Patent
Maeda

(10) Patent No.: US 10,658,057 B2
(45) Date of Patent: May 19, 2020

(54) SEMICONDUCTOR MEMORY DEVICE

(71) Applicant: Toshiba Memory Corporation, Minato-ku (JP)

(72) Inventor: Takashi Maeda, Kamakura (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/290,383

(22) Filed: Mar. 1, 2019

(65) Prior Publication Data

US 2020/0090772 A1    Mar. 19, 2020

(30) Foreign Application Priority Data

Sep. 19, 2018   (JP) .................................. 2018-175450

(51) Int. Cl.
*G11C 7/10* (2006.01)
*G11C 16/34* (2006.01)
(Continued)

(52) U.S. Cl.
CPC .......... *G11C 16/3459* (2013.01); *G11C 16/08* (2013.01); *G11C 16/16* (2013.01);
(Continued)

(58) Field of Classification Search
CPC ..... G11C 16/3459; G11C 16/08; G11C 16/16; G11C 16/24
(Continued)

(56) References Cited

U.S. PATENT DOCUMENTS 7,196,933 B2   3/2007   Shibata
7,310,269 B2   12/2007  Shibata
(Continued)

FOREIGN PATENT DOCUMENTS

JP   2006-172523   6/2006
JP   2009-163793   7/2009
(Continued)

OTHER PUBLICATIONS

Tomoharu Tanaka et al. "A 768Gb 3b/cell 3D-Floating-Gate NAND Flash Memory", ISSCC 2016, Session 7, Nonvolatile Memory Solutions, 7.7, pp. 142-144.
(Continued)

*Primary Examiner* — Vu A Le
(74) *Attorney, Agent, or Firm* — Oblon, McClelland, Maier & Neustadt, L.L.P.

(57) ABSTRACT

A semiconductor memory device of one embodiment includes a p-type first semiconductor region, n word lines from the first to nth word lines stacked on the first semiconductor region in a first direction, an n-type second semiconductor region, a semiconductor layer between the first semiconductor region and the second semiconductor region, extending in the first direction, and intersecting with the n word lines, and a control circuit which, when verifying whether or not a kth memory cell provided in a region where a kth (4<k<n) word line and the semiconductor layer intersect with each other has reached a desired threshold voltage, executes a first verify operation of applying a first voltage between the first semiconductor region and the second semiconductor region and a second verify operation of applying a second voltage different from the first voltage, between the first semiconductor region and the second semiconductor region.

16 Claims, 22 Drawing Sheets

(51) Int. Cl.
*G11C 16/16* (2006.01)
*G11C 16/26* (2006.01)
*H01L 27/1157* (2017.01)
*G11C 16/24* (2006.01)
*H01L 27/11582* (2017.01)
*G11C 16/08* (2006.01)

(52) U.S. Cl.
CPC .............. *G11C 16/24* (2013.01); *G11C 16/26* (2013.01); *H01L 27/1157* (2013.01); *H01L 27/11582* (2013.01)

(58) Field of Classification Search
USPC .................................................. 365/189.011
See application file for complete search history.

(56) References Cited

U.S. PATENT DOCUMENTS

| | | | |
|---|---|---|---|
| 7,440,325 | B2 | 10/2008 | Shibata |
| 7,573,750 | B2 | 8/2009 | Shibata |
| 7,920,421 | B2 | 4/2011 | Maejima et al. |
| 7,929,352 | B2 | 4/2011 | Shibata |
| 8,203,889 | B2 | 6/2012 | Shibata |
| 8,559,226 | B2 | 10/2013 | Abe et al. |
| 8,625,356 | B2 | 1/2014 | Shibata |
| 9,524,787 | B2 | 12/2016 | Maejima |
| 9,536,618 | B2 * | 1/2017 | Zhao .................. G11C 16/3459 |
| 9,570,173 | B2 | 2/2017 | Yoshihara et al. |
| 9,589,648 | B1 | 3/2017 | Maeda |
| 9,666,296 | B1 | 5/2017 | Maejima |
| 10,008,269 | B2 | 6/2018 | Maejima |
| 10,037,813 | B2 | 7/2018 | Maejima et al. |
| 2015/0049553 | A1 | 2/2015 | Maejima |
| 2016/0005479 | A1 | 1/2016 | Lee et al. |
| 2018/0261289 | A1 | 9/2018 | Maejima |
| 2018/0315486 | A1 | 11/2018 | Maejima et al. |
| 2019/0214100 | A1* | 7/2019 | Puthenthermadam ..................... G11C 11/5671 |

FOREIGN PATENT DOCUMENTS

| | | |
|---|---|---|
| JP | 2011-258289 | 12/2011 |
| JP | 5127439 B2 | 1/2013 |
| JP | 2016-170845 | 9/2016 |
| JP | 2017-45492 | 3/2017 |
| JP | 2017-142874 | 8/2017 |
| JP | 6313252 B2 | 4/2018 |

OTHER PUBLICATIONS

C. Caillat et al. "3DNAND GIDL—Assisted Body Biasing for Erase Enabling CMOS Under Array (CUA) Architecture", 2017 IEEE, 4 pages.

Nagyong Choi et al. "First Demonstration of Diode-Type 3-D NAND Flash Memory String Having Super-Steep Switching Slope," 2017 Symposium on VLSI Technology Digest of Technical Papers, pp. T204-T205.

Sung-Min Joe et al. "Diode-Type NAND Flash Memory Cell String Having Super-Steep Switching Slope Based on Positive Feedback," IEEE Transactions on Electron Devices, vol. 63, No. 4, Apr. 2016, pp. 1533-1538.

J. Wan et al. "$Z^2$-FET: A zero-slope switching device with gate-controlled hysteresis," IEEE, 2012, 2 pages.

* cited by examiner

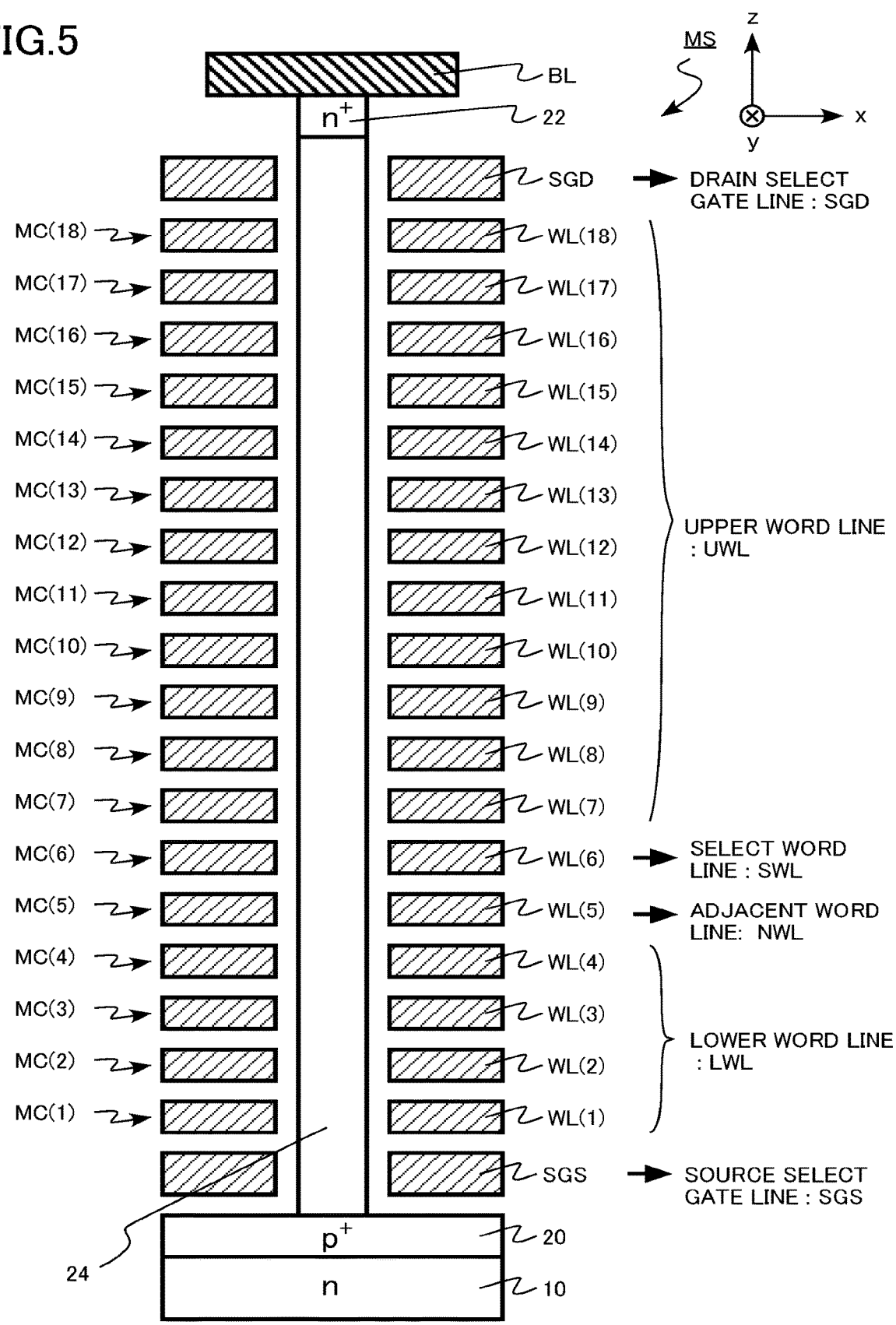

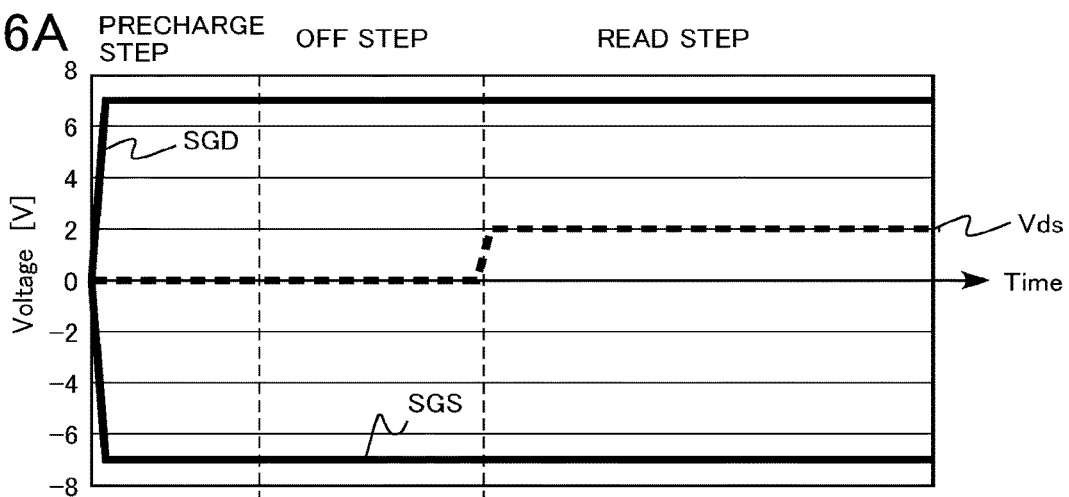
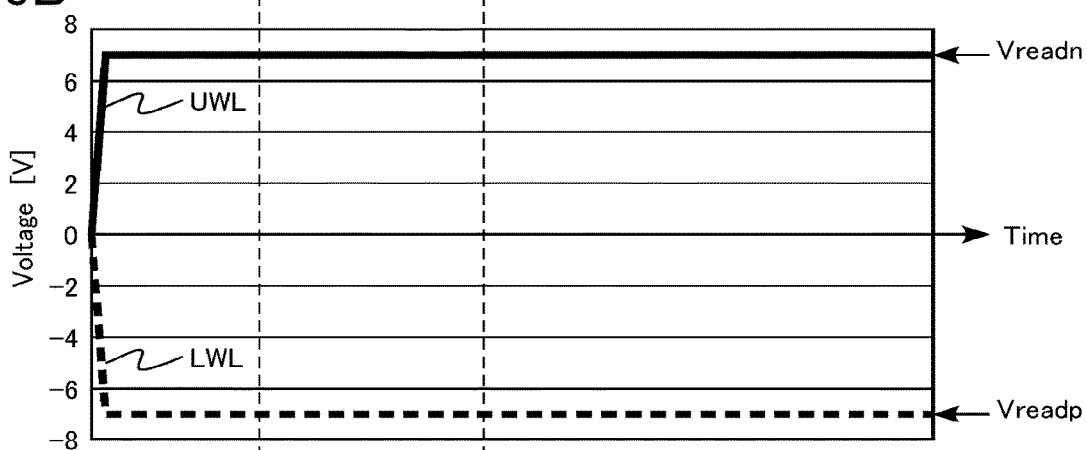
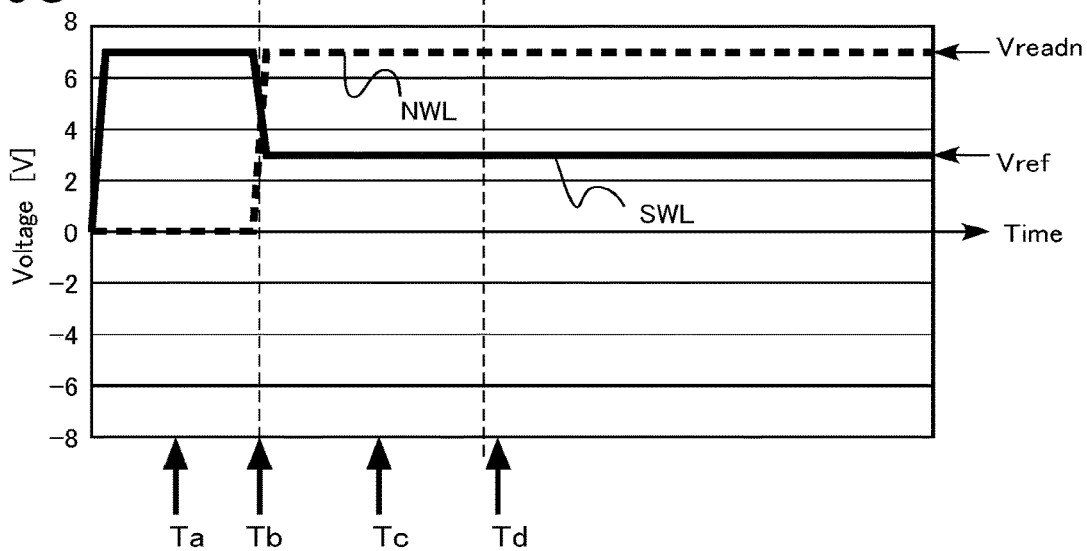

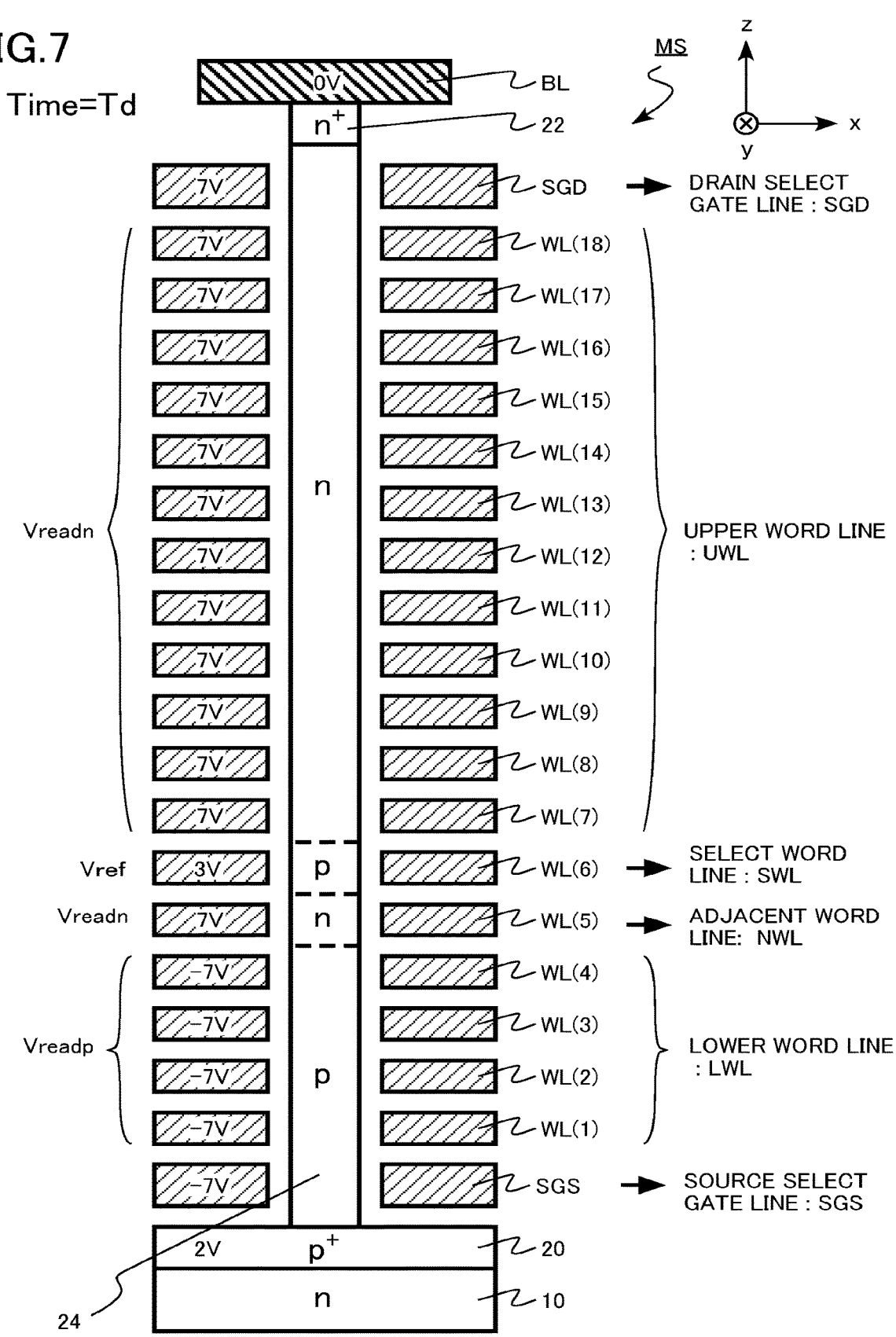

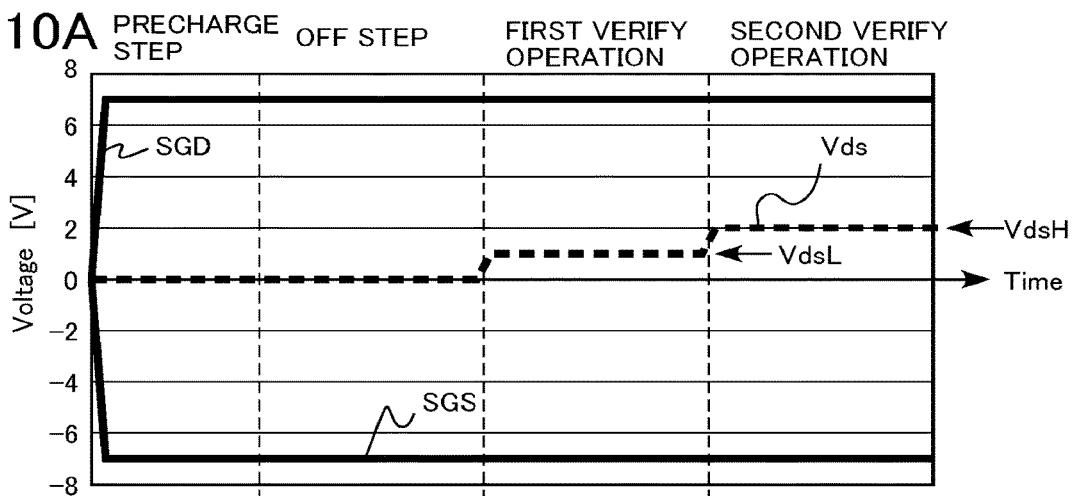
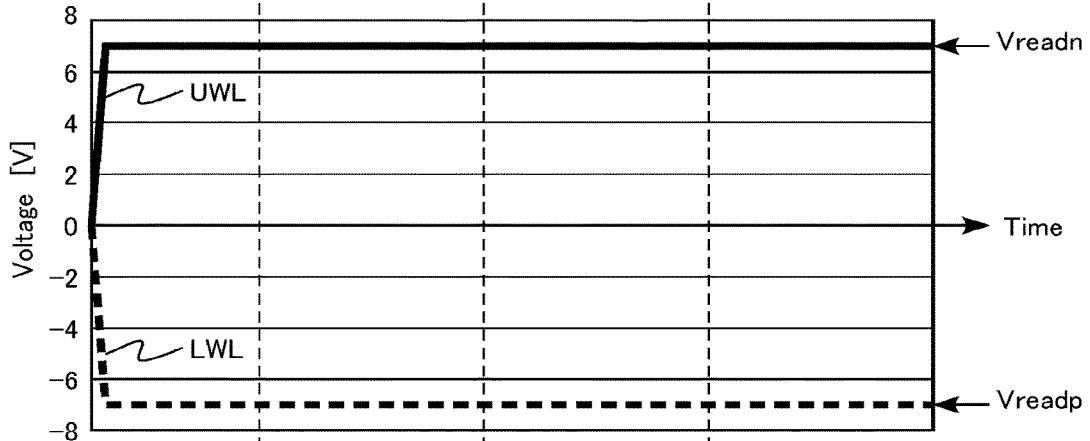
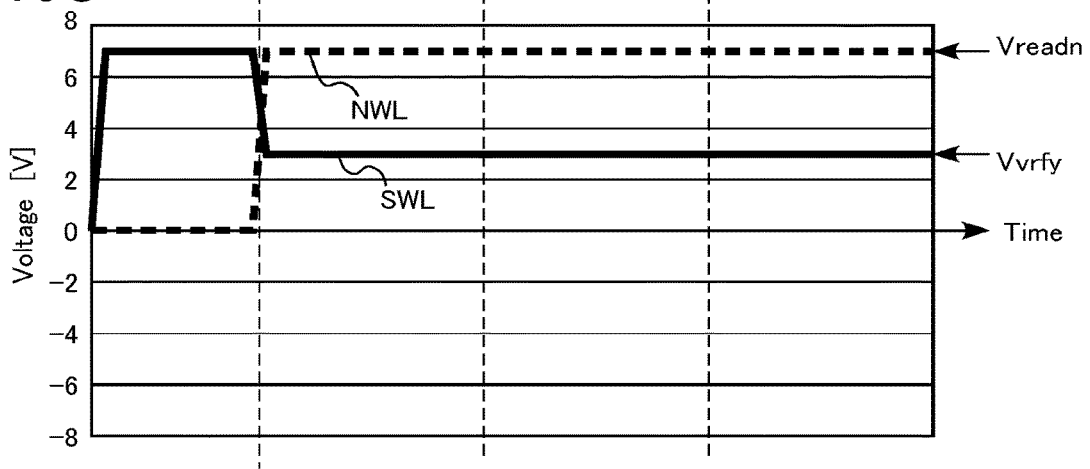

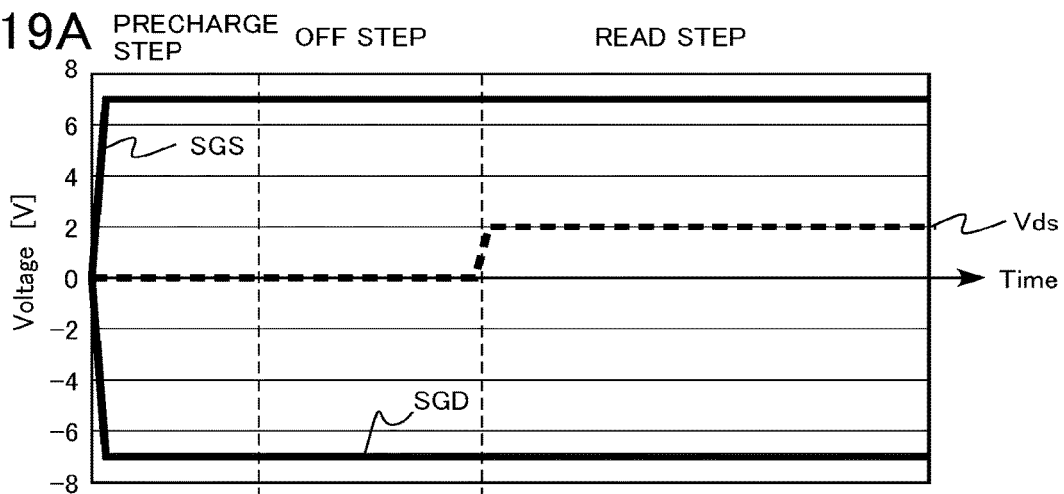
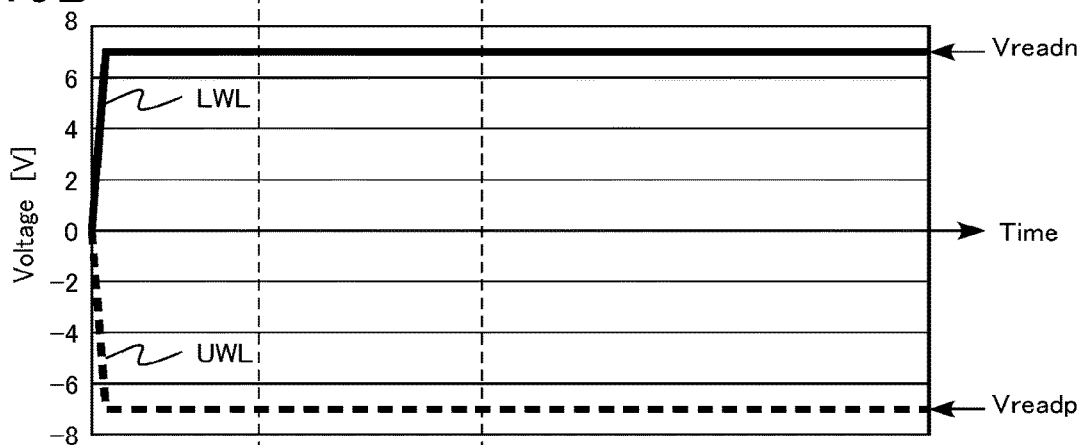
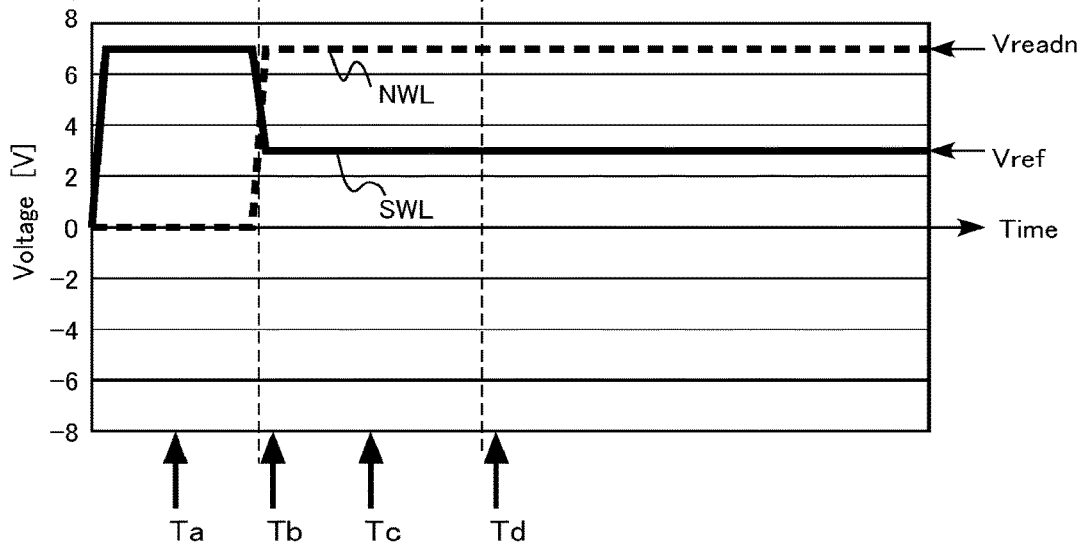

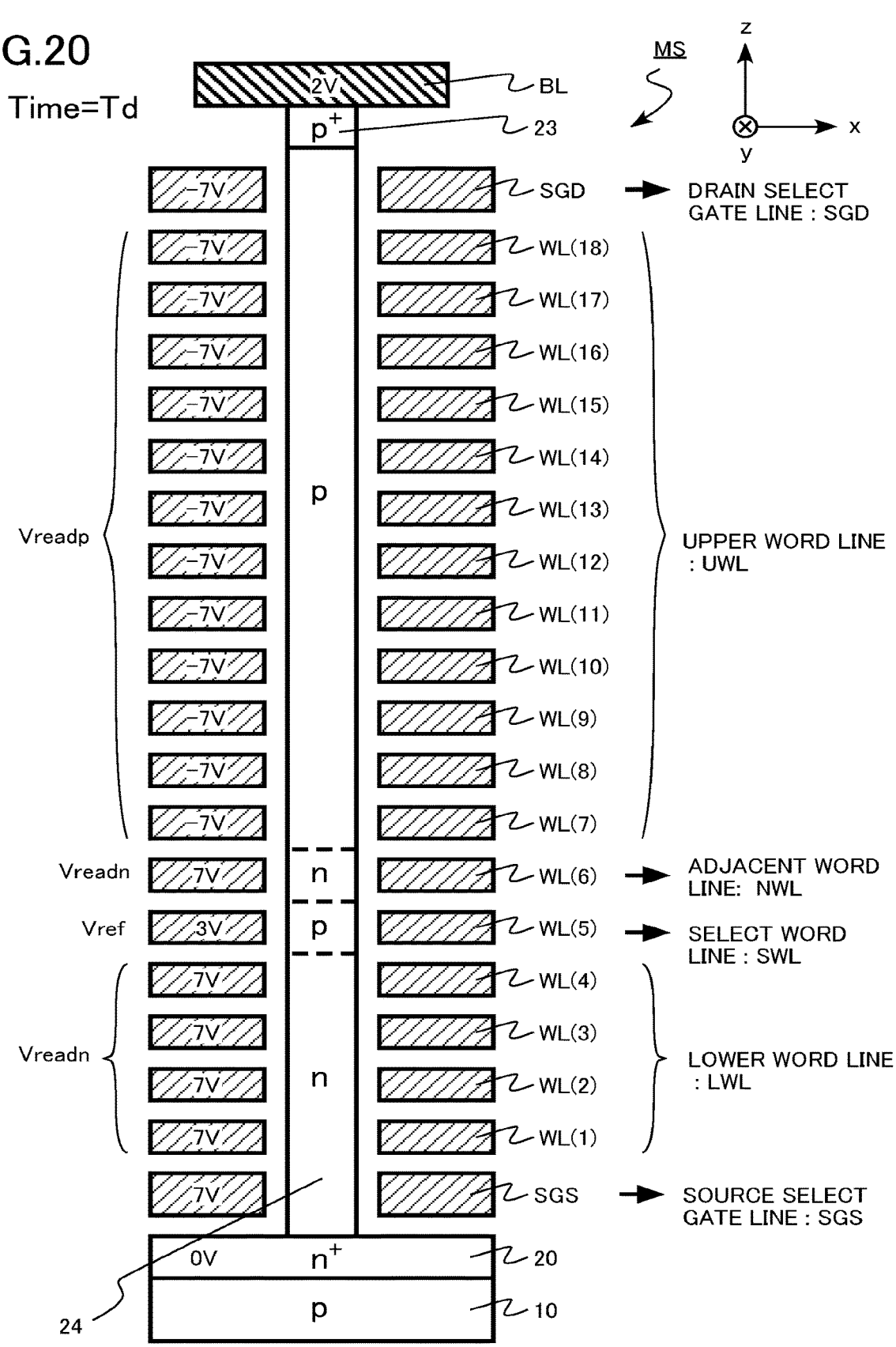

SEMICONDUCTOR MEMORY DEVICE

CROSS-REFERENCE TO RELATED APPLICATION

This application is based upon and claims the benefit of priority from Japanese Patent Application No. 2018-175450, filed on Sep. 19, 2018, the entire contents of which are incorporated herein by reference.

FIELD

Embodiments described herein relate generally to a semiconductor memory device.

BACKGROUND

A three-dimensional NAND flash memory in which memory cells are three-dimensionally disposed realize a large integration and low cost. In order to improve read characteristics of a three-dimensional NAND flash memory, a positive feedback type three-dimensional NAND flash memory having a p-type semiconductor region at one end of a memory string has been proposed. The positive feedback type three-dimensional NAND flash memory has a sharp subthreshold slope since a transistor of a memory cell performs a thyristor operation. Accordingly, the read characteristics of the memory cell are improved.

In order to increase the capacity of the three-dimensional NAND flash memory, memory cells may be set into multi-levels to each store data of a plurality of bits. To set memory cells into multi-levels, threshold voltages of the memory cells (amount of electric charge accumulated in charge accumulation regions of the memory cells) should be controlled to have a plurality of distributions in a write operation. It is important to narrow the widths of the threshold voltage distributions of the memory cells in order to prevent/suppress erroneous reading in a read operation. Even in the positive feedback type three-dimensional NAND flash memory, when memory cells are set into multi-levels, it is desired to narrow the width of the threshold voltage distributions of the memory cells.

BRIEF DESCRIPTION OF THE DRAWINGS

FIG. 5 is a schematic diagram illustrating a data read operation of the semiconductor memory device of the first embodiment;

FIGS. 6A, 6B and 6C are timing charts of the data read operation of the semiconductor memory device of the first embodiment;

FIG. 7 is a schematic diagram illustrating the data read operation of the semiconductor memory device of the first embodiment;

FIGS. 10A, 10B and 10C are timing charts of a verify operation of the semiconductor memory device of the first embodiment;

FIGS. 19A, 19B and 19C are timing charts of the data read operation of the semiconductor memory device of the third embodiment;

FIG. 20 is a schematic diagram illustrating the data read operation of the semiconductor memory device of the third embodiment;

DETAILED DESCRIPTION

Figure 1:
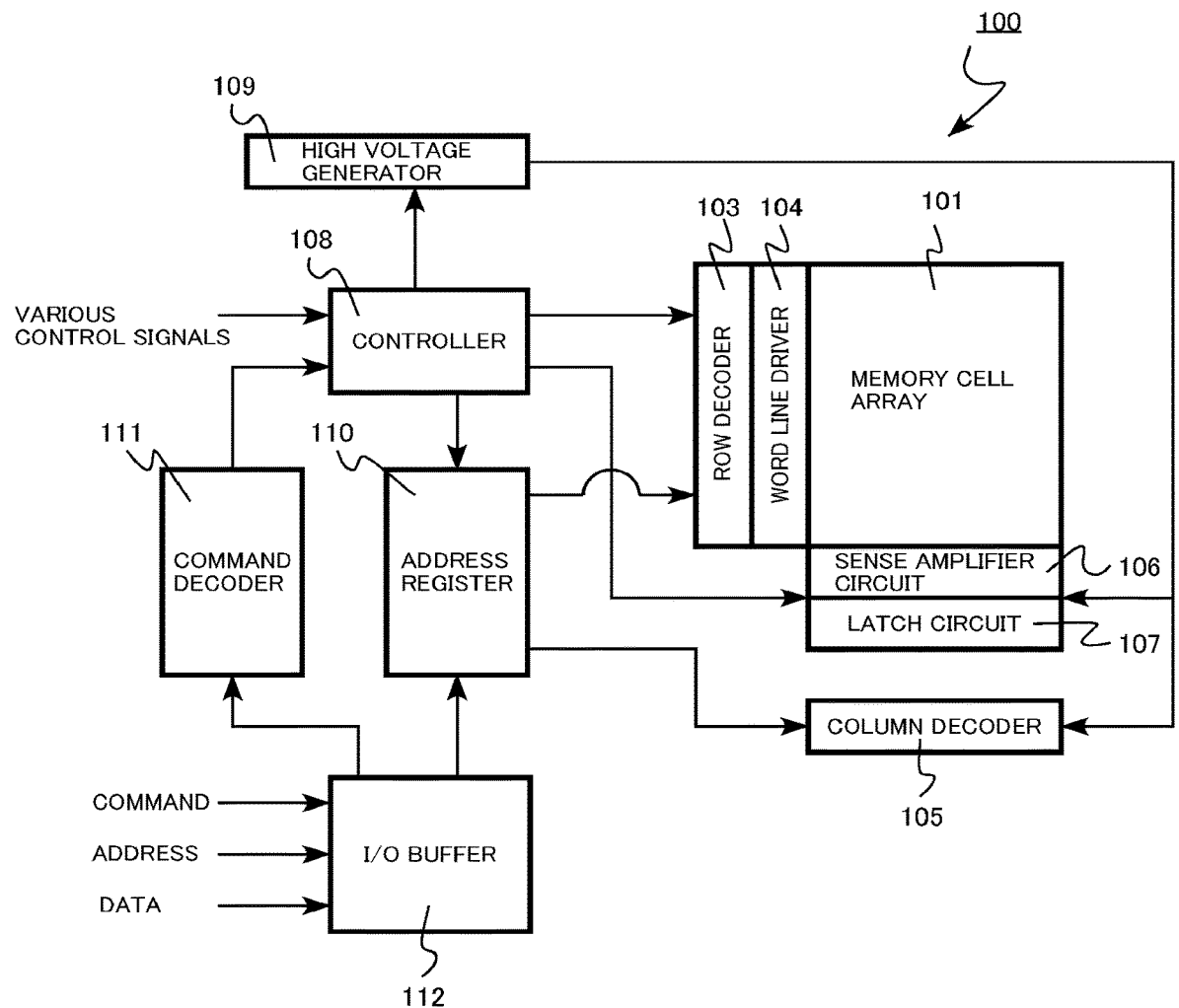
FIG. 1 is a block diagram of a semiconductor memory device of a first embodiment.

A semiconductor memory device of each embodiment includes a first semiconductor region of p-type; n word lines from a first word line to an nth word line stacked on the first semiconductor region in a first direction; a second semiconductor region of n-type; a semiconductor layer provided between the first semiconductor region and the second semiconductor region, the semiconductor layer extending in the first direction, and the semiconductor layer intersecting with the n word lines; a bit line electrically connected to the second semiconductor region; and a control circuit configured to perform a first verify operation and a second verify operation after the first verify operation, wherein, to verify whether or not a kth (4<k<n) memory cell provided in a region where a kth word line and the semiconductor layer intersect with each other has reached a desired threshold voltage, a first voltage is applied between the first semiconductor region and the second semiconductor region in the first verify operation, and a second voltage different from the first voltage is applied between the first semiconductor region and the second semiconductor region in the second verify operation.

Hereinafter, embodiments of the present disclosure will be described with reference to the drawings. In the following description, the same or similar members and the like are denoted by the same reference numerals, and a description of the members and the like once described is omitted as appropriate.

In the present specification, the term "above" or "below" may be used for the sake of convenience. The term "above" or "below" indicates a relative positional relationship within a drawing and does not define a positional relationship with respect to gravity.

First Embodiment

A semiconductor memory device of a first embodiment includes a first semiconductor region of p-type, n word lines from a first word line to a nth word line stacked on the first semiconductor region in a first direction, a second semiconductor region of n-type, a semiconductor layer provided between the first semiconductor region and the second semiconductor region, the semiconductor layer extending in the first direction, and the semiconductor layer intersecting with the n word lines, a bit line electrically connected to the second semiconductor region. And the semiconductor memory device includes a control circuit controlling a first verify operation and a second verify operation following the first verify operation when verifying whether or not a kth ($4<k<n$) memory cell provided in a region where a kth word line and the semiconductor layer intersect with each other has reached a desired threshold voltage, the first verify operation applying a first voltage between the first semiconductor region and the second semiconductor region, and the second verify operation applying a second voltage different from the first voltage between the first semiconductor region and the second semiconductor region.

Figure 2:
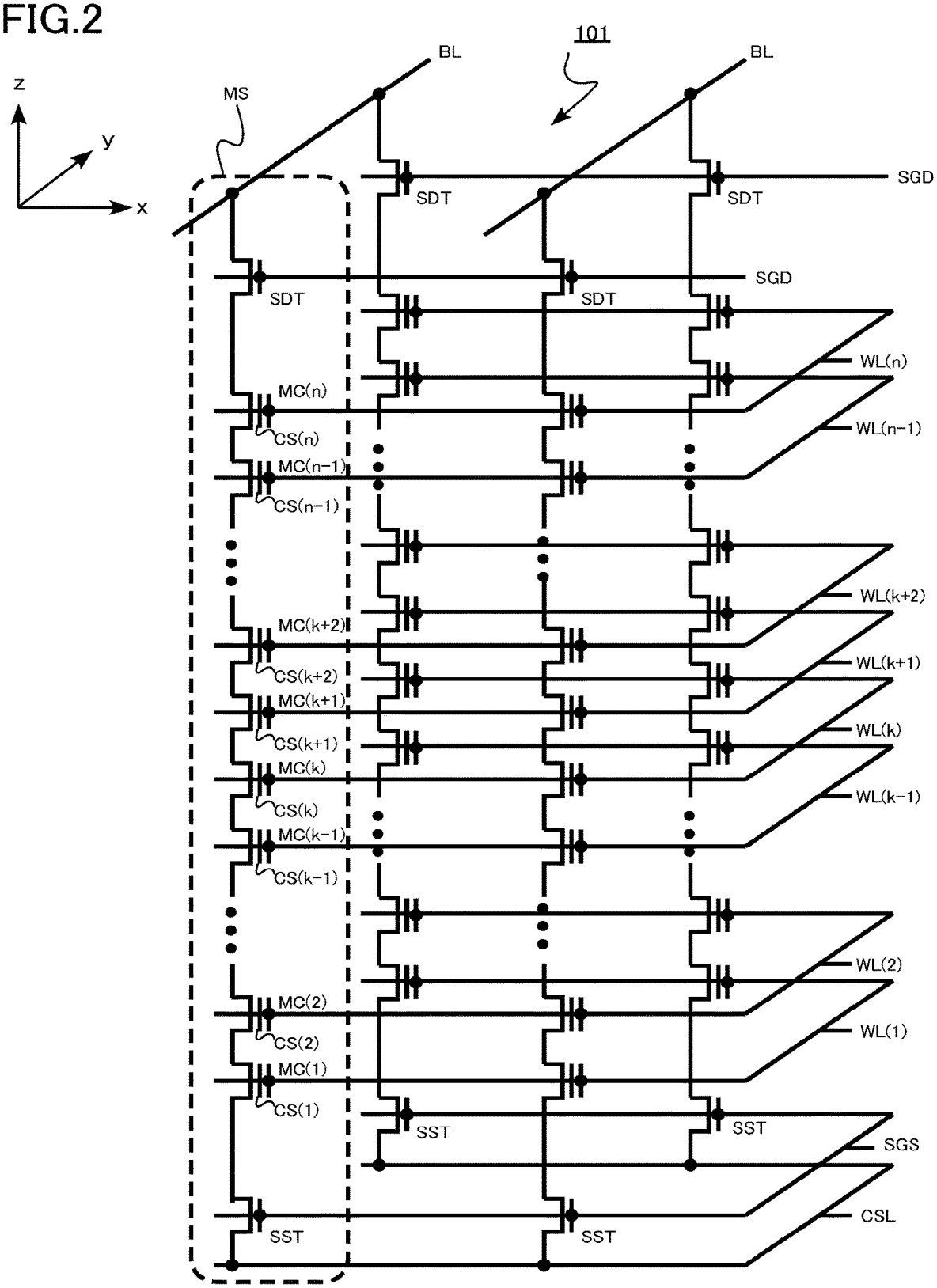
FIG. 2 is a circuit diagram of a memory cell array of the semiconductor memory device of the first embodiment.
Figure 3:
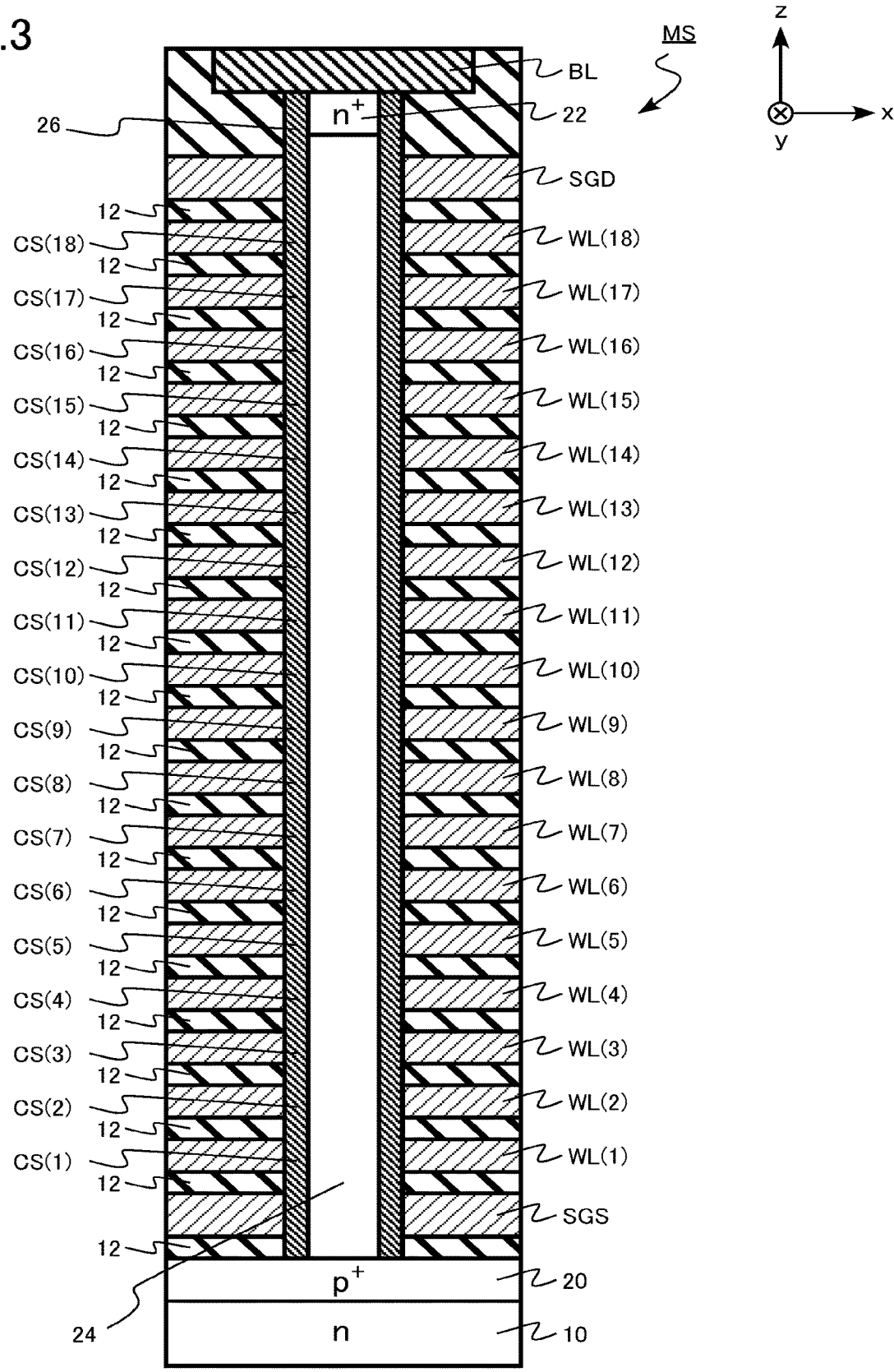
FIG. 3 is a schematic cross-sectional view of a memory string of the semiconductor memory device of the first embodiment.

FIG. 1 is a block diagram of a semiconductor memory device 100 of the first embodiment. FIG. 2 is a circuit diagram of a memory cell array 101 of the semiconductor memory device 100 of the first embodiment. FIG. 3 is a schematic cross-sectional view of a memory string MS of the semiconductor memory device 100 of the first embodiment. FIG. 3 shows a cross section of one memory string MS surrounded by, for example, a dotted line in the memory cell array 101 of FIG. 2.

The semiconductor memory device of the first embodiment is a three-dimensional NAND flash memory in which memory cells are three-dimensionally disposed. The semiconductor memory device of the first embodiment is a positive feedback type three-dimensional NAND flash memory in which a p-type semiconductor region is provided at one end of the memory string MS.

The three-dimensional NAND flash memory of the first embodiment includes a memory cell array 101, a row decoder 103, a word line driver 104, a column decoder 105, a sense amplifier circuit 106, a latch circuit 107, a controller 108, a high voltage generator 109, an address register 110, a command decoder 111, and an I/O buffer 112. The row decoder 103, the word line driver 104, the column decoder 105, the sense amplifier circuit 106, the data latch circuit 107, the controller 108, the high voltage generator 109, the address register 110, and the command decoder 111 are examples of the control circuit.

As shown in FIG. 2, the memory cell array 101 includes a plurality of word lines WL, a common source line CSL, a plurality of source select gate lines SGS, a plurality of drain select gate lines SGD, a plurality of bit lines BL, and a plurality of memory strings MS. In FIG. 2, the x direction (the second direction), the y direction (the third direction), and the z direction (the first direction) are directions orthogonal to each other.

n word lines WL from the first to nth are provided. n is an integer of 2 or more. The n word lines WL are stacked in the z direction. Each of the word lines WL is denoted as WL(k). k is an integer of $1 \leq k \leq n$. WL(k) is referred to as the kth word line WL. WL(1), WL(2) . . . WL(k−1), WL(k), WL(k+1), WL(k+2) . . . WL(n−1), and WL(n) are stacked in this order from the lower side to the upper side of the memory cell array 101.

As shown in FIG. 2, the memory string MS is constituted of a source select transistor SST, a plurality of memory cells MC, and a drain select transistor SDT connected in series between the common source line CSL and the bit line BL.

n memory cells MC from the first to nth are provided. n is an integer of 2 or more. The n memory cells MC are connected in series in the z direction. Each of the memory cells MC is denoted as MC(k). k is an integer of $1 \leq k \leq n$. MC(k) is referred to as the kth memory cell MC.

Each of the memory cells MC has a charge accumulation region CS. n charge accumulation regions CS from the first to nth are provided. Each of the charge accumulation regions CS is denoted as CS(k). k is an integer of $1 \leq k \leq n$. CS(k) is referred to as the kth charge accumulation region CS.

Each of the word lines WL connected to each of the memory cells MC in the memory string MS is connected to the word line driver 104. The row decoder 103 decodes a row address transferred from the address register 110. The word line driver 104 is disposed in the vicinity of the row decoder 103. The word line driver 104 generates a voltage to drive each of the word lines WL, on the basis of decoded data.

The bit line BL connected to each of the memory strings MS is connected to the sense amplifier circuit 106. The sense amplifier circuit 106 detects read data from the memory cell MC according to the amount of current flowing from the bit line BL. The read data detected by the sense amplifier circuit 106 is held as, for example, four-level data in the latch circuit 107.

The column decoder 105 decodes a column address from the address register 110. In addition, the column decoder 105 determines whether the data held in the latch circuit 107 is transferred to a data bus, on the basis of a decoding result.

The I/O buffer 112 buffers an address, data, and a command input from an I/O terminal. In addition, the I/O buffer 112 transfers the address to the address register 110, transfers the command to a command register, and transfers the data to the data bus.

The controller 108 identifies the address and the command and controls an operation of the sense amplifier circuit 106 described above.

FIG. 3 is a schematic cross-sectional view of one memory string MS. FIG. 3 illustrates a case where the number of the word lines WL is eighteen, that is, n=18.

The memory string MS includes a semiconductor substrate 10, an interlayer insulating layer 12, eighteen word lines WL(1) to WL(18) (hereinafter also simply referred to as the word line WL) from the first to the eighteenth, a p-type semiconductor region 20 (first semiconductor region), an n-type semiconductor region 22 (second semiconductor region), a semiconductor layer 24, a charge accumulation film 26, the bit line BL, the source select gate line SGS, and the drain select gate line SGD. The charge accumulation film 26 includes first to eighteenth charge accumulation regions CS(1) to CS(18) (hereinafter also simply referred to as the charge accumulation region CS).

The semiconductor substrate 10 is, for example, a single-crystal n-type silicon substrate. The semiconductor substrate 10 contains, for example, phosphorus (P) as an n-type impurity.

The p-type semiconductor region 20 is provided in the semiconductor substrate 10. The p-type semiconductor region 20 contains a p-type impurity. The p-type impurity is, for example, boron (B). The p-type impurity concentration of the p-type semiconductor region 20 is, for example, $1\times10^{19}$ cm$^{-3}$ or more. The p-type semiconductor region 20 functions as a common source line CSL.

The n-type semiconductor region 22 is provided on the bit line BL side of the semiconductor layer 24. The n-type semiconductor region 22 contains an n-type impurity. The n-type semiconductor region 22 is, for example, polycrystalline silicon containing an n-type impurity. The n-type impurity is, for example, phosphorus (P) or arsenic (As). The n-type impurity concentration of the n-type semiconductor region 22 is, for example, $1\times10^{19}$ cm$^{-3}$ or more.

The word line WL is provided on the semiconductor substrate 10. The word line WL is provided on the p-type semiconductor region 20. The word line WL is, for example, a plate-like conductive layer. The interlayer insulating layer 12 is provided between the word lines WL. The word lines WL are stacked in the z direction (first direction). The word lines WL(1) to WL(18) function as control electrodes of the respective memory cells MC(1) to MC(18) (hereinafter also simply referred to as the memory cell MC).

The word line WL is, for example, polycrystalline silicon containing a conductive impurity. Further, the word line WL is, for example, a metal. The interlayer insulating layer 12 is, for example, silicon oxide.

The semiconductor layer 24 is provided between the p-type semiconductor region 20 and the n-type semiconductor region 22. The semiconductor layer 24 is electrically connected to the p-type semiconductor region 20 and the n-type semiconductor region 22. The semiconductor layer 24 is in contact with the p-type semiconductor region 20 and the n-type semiconductor region 22. The semiconductor layer 24 penetrates through the eighteen word lines WL(1) to WL(18). The semiconductor layer 24 extends in the z direction. The semiconductor layer 24 has, for example, a columnar or cylindrical shape. The semiconductor layer 24 is surrounded by the word lines WL(1) to WL(18).

The semiconductor layer 24 is, for example, polycrystalline silicon. The n-type impurity concentration of the semiconductor layer 24 is lower than the n-type impurity concentration of the n-type semiconductor region 22. The p-type impurity concentration of the semiconductor layer 24 is lower than the p-type impurity concentration of the p-type semiconductor region 20. The n-type impurity concentration and the p-type impurity concentration of the semiconductor layer 24 are, for example, $1\times10^{17}$ cm$^{-3}$ or less. The semiconductor layer 24 is, for example, an intrinsic semiconductor.

The charge accumulation film 26 is provided between the word line WL and the semiconductor layer 24. The charge accumulation film 26 is provided, for example, around the semiconductor layer 24. The charge accumulation film 26 has a function of accumulating charges inside the charge accumulation film 26 by an electric field applied to the charge accumulation film 26. It is also possible to erase the charge accumulated in the charge accumulation film 26 by applying the electric field to the charge accumulation film 26.

The charge accumulation film 26 has, for example, a stacked structure of a silicon oxide film, a silicon nitride film, and a silicon oxide film. Further, the charge accumulation film 26 has, for example, a stacked structure of a silicon oxide film, a silicon film, and a silicon oxide film. The charge accumulation film 26 accumulates electrons in a silicon nitride film or a silicon film, for example. The charge accumulation film 26 may be, for example, a semiconductor such as silicon or a metal.

The first to eighteenth charge accumulation regions CS(1) to CS(18) are provided between the respective word lines WL(1) to WL(18) and the semiconductor layer 24. The charge accumulation regions CS(1) to CS(18) are portions of the charge accumulation film 26.

The memory cell MC is provided in a region where the word line WL intersects with the semiconductor layer 24. The memory cell MC is constituted of the word line WL, the charge accumulation region CS, and the semiconductor layer 24. The memory cell MC has a function of holding data based on the charge amount in the charge accumulation region CS.

The data held in the memory cell MC is, for example, the threshold voltage of a memory cell transistor. For example, data of two or more levels can be stored in the memory cell MC using different threshold voltages.

The bit line BL is electrically connected to the n-type semiconductor region 22. The bit line BL is, for example, in contact with the n-type semiconductor region 22. The bit line BL has a function of transmitting data read from the memory cell MC. Further, the bit line BL has a function of transmitting data to be written to the memory cell MC. The bit line BL is, for example, a metal.

The source select transistor SST has a function of selecting the memory string MS based on a signal applied to the source select gate line SGS. The drain select transistor SDT has a function of selecting the memory string MS based on a signal applied to the drain select gate line SGD.

For example, a ground potential or a potential higher than the bit line BL is applied to the common source line CSL.

Next, an operation of the three-dimensional NAND flash memory of the first embodiment will be described. First, a write operation (program operation), a read operation, and an erase operation will be described. Particularly, a characteristic read operation in the positive feedback type three-dimensional NAND flash memory will be described in detail.

Figure 4:
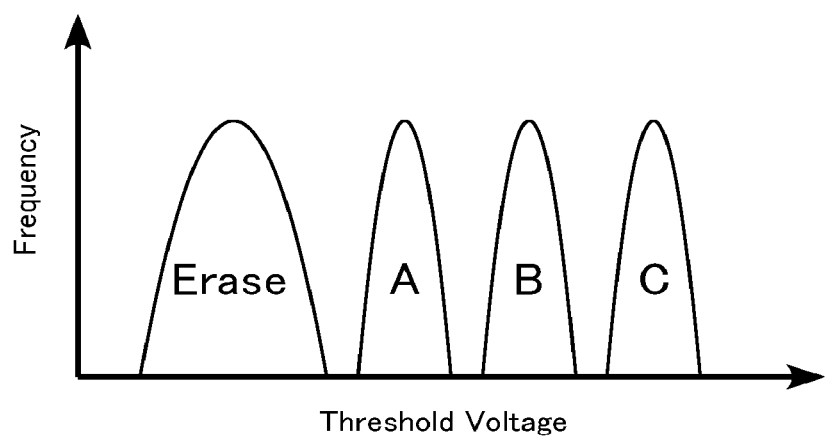
FIG. 4 is an explanatory diagram of a threshold voltage distribution of a memory cell written in the semiconductor memory device of the first embodiment.

FIG. 4 is an explanatory diagram of threshold voltage distributions of the memory cells written in the semiconductor memory device of the first embodiment. The three-dimensional NAND flash memory of the first embodiment is, for example, a 4-value memory cell in which one memory cell MC stores four values. One memory cell MC stores 2 bits.

In FIG. 4, the horizontal axis represents a threshold voltage of the memory cell MC, and the vertical axis represents the frequency of the threshold voltage. The number of threshold voltage distributions of the 4-value memory cell is four.

One of the threshold voltage distributions is an erase cell distribution ("Erase" in FIG. 4) to which the memory cell MC in an erase state belongs. The other memory cells MC are separately programmed into three threshold voltage distributions in the course of data write operation (program operation). The three threshold voltage distributions are realized by changing the magnitude of the program voltage (Vprog) applied between the word line WL and the semiconductor layer 24 in the write operation. In the write operation, electrons are injected into the charge accumulation region CS by making the voltage on the word line WL side relatively positive with respect to the semiconductor layer 24 side.

Hereinafter, these three threshold voltage distributions will be referred to respectively as a threshold voltage distribution A, a threshold voltage distribution B, and a threshold voltage distribution C in order from the side closer to the erase cell distribution. In the threshold voltage distribution A, the threshold voltage distribution B, and the threshold voltage distribution C, there is a memory cell MC having a higher threshold voltage than the erase cell distribution.

FIG. 5 is a schematic diagram illustrating a data read operation of the semiconductor memory device of the first embodiment. FIGS. 6A, 6B and 6C are timing charts of the data read operation of the semiconductor memory device of the first embodiment.

For example, when reading data based on the charge amount in the kth (4<k<n) charge accumulation region, the control circuit applies a negative voltage to the first to (k−2)th word lines WL, applies a positive voltage to the (k+1)th to nth word lines WL, applies a positive voltage to a (k−1)th conductive layer, and applies a read voltage to a kth conductive layer.

FIG. 5 shows the designation of each layer and each region. Hereinafter, a case where data of the memory cell MC controlled by selected word line SWL is read will be described as an example. In particular, the case of reading data of the memory cell MC(6), that is, the case where k=6 will be described as an example.

The selected word line SWL corresponds to the word line WL(6). An adjacent word line NWL adjacent to the selected word line SWL corresponds to the word line WL(5). A lower word line LWL corresponds to the word lines WL(1) to WL(4). An upper word line UWL corresponds to the word lines WL(7) to WL(18).

As shown in FIGS. 6A, 6B, and 6C, the read operation for reading data of the memory cell MC includes a precharge step, an off step, and a read step. The voltage value shown in FIG. 6 is an example of a voltage value applied to each layer or each region.

FIG. 6A is the timing chart of the source select gate line SGS, the drain select gate line SGD, and a drain-source voltage Vds. FIG. 6B is the timing chart of the lower word line LWL and the upper word line UWL. FIG. 6C is the timing chart of the selected word line SWL and the adjacent word line NWL. The drain-source voltage Vds is a voltage applied between the p-type semiconductor region 20 and the n-type semiconductor region 22.

The precharge step is a step for initializing a state of the memory cell MC before the read step. By the precharge step, for example, the instability of the read operation is eliminated. The precharge step may be omitted.

In the precharge step, a negative voltage is applied to the source select gate line SGS and the lower word line LWL. A negative voltage Vreadp is applied to the lower word line LWL. A positive voltage Vreadn is applied to the selected word line SWL.

A positive voltage is applied to the drain select gate line SGD and the upper word line UWL. The positive voltage Vreadn is applied to the upper word line UWL. 0 V is applied to the adjacent word line NWL. The drain-source voltage Vds is 0 V (Ta in FIG. 6).

In the precharge step, holes are accumulated in the semiconductor layer 24 facing the source select gate line SGS and the lower word line LWL to be made to have p-type conductivity. Electrons are accumulated in the semiconductor layer 24 facing the selected word line SWL, the drain select gate line SGD, and the upper word line UWL to be made to have n-type conductivity.

The off step is a step for forming an energy barrier against charges in the semiconductor layer 24. When shifting from the precharge step to the off step, the voltage applied to the selected word line SWL is changed from the positive voltage Vreadn to a read voltage Vref. The voltage applied to the adjacent word line NWL is changed from 0 V to the positive voltage Vreadn (Tb in FIG. 6).

The voltage applied to the selected word line SWL is set to the read voltage Vref, and the voltage applied to the adjacent word line NWL is made positive voltage, so that an energy barrier against charges is formed in the semiconductor layer 24 (Tc in FIG. 6).

FIG. 7 is a schematic diagram illustrating the data read operation of the semiconductor memory device of the first embodiment. FIG. 7 is a schematic cross-sectional view showing an applied voltage and a state of the semiconductor layer 24 at a time Td of the read operation. The voltage value shown in FIG. 7 is an example of a voltage value applied to each layer or each region.

As shown in FIG. 7, the voltage applied to the selected word line SWL is set to Vref, whereby the semiconductor layer 24 facing the selected word line SWL is made to have p-type conductivity. On the other hand, a voltage applied to the adjacent word line NWL is set to the positive voltage Vreadn, whereby the semiconductor layer 24 facing the adjacent word line NWL is made to have n-type conductivity. Accordingly, a thyristor structure using a pnpn structure is formed in the semiconductor layer 24 from the p-type semiconductor region 20 toward the n-type semiconductor region 22.

Hereinafter, among the memory cells MC belonging to the selected memory string MS, the memory cell MC having the selected word line SWL is referred to as a selected memory cell, and the memory cell having the adjacent word line NWL is referred to as an adjacent memory cell.

The read step is a step of actually reading the data of the memory cell MC. The drain-source voltage Vds increases from 0 V to a positive voltage (Td in FIG. 6). Here, a relatively high voltage with respect to the n-type semiconductor region 22 is applied to the p-type semiconductor region 20. When the energy barrier against the electrons of the semiconductor layer 24 facing the selected word line SWL is low, a thyristor operation occurs, and an electric current flows between the p-type semiconductor region 20 and the n-type semiconductor region 22.

Figure 8:
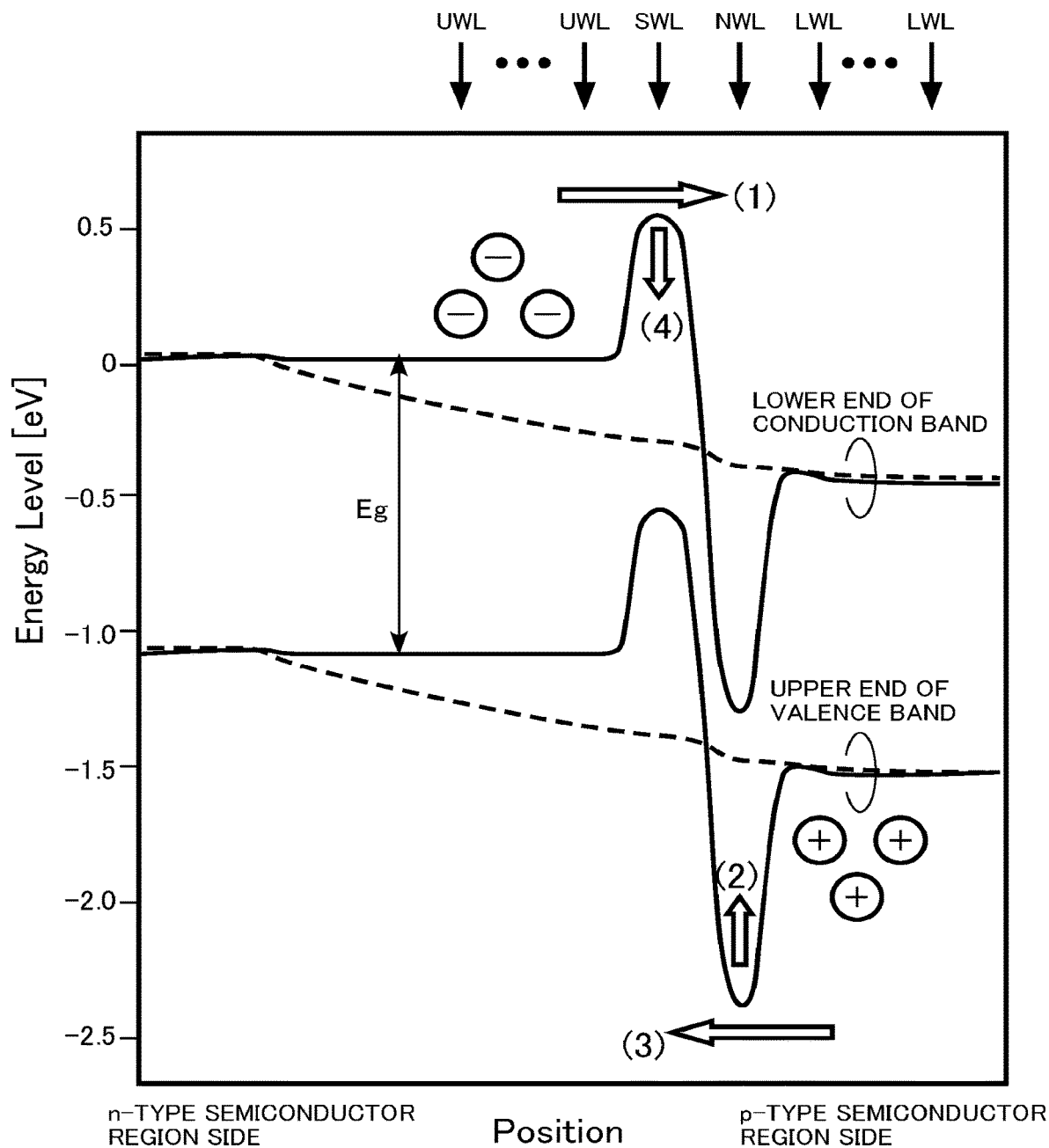
FIG. 8 is a band diagram illustrating the read operation of the semiconductor memory device of the first embodiment.

FIG. 8 is a band diagram illustrating the read operation of the semiconductor memory device of the first embodiment. FIG. 8 shows energy levels at a lower end of a conduction band and an upper end of a valence band. Eg in FIG. 8 is band gap energy.

Vref is applied to the selected word line SWL, and the energy barrier against electrons is formed in the semiconductor layer 24 facing the selected word line SWL. The height of the energy barrier is determined by the level of the threshold voltage of the selected memory cell MC. When the threshold voltage is high, the energy barrier is high, and when the threshold voltage is low, the energy barrier is low. Since the positive voltage Vreadn is applied to the adjacent word line NWL, the energy barrier against holes is formed in the semiconductor layer 24 facing the adjacent word line NWL.

The read operation proceeds to the read step, and when a positive voltage is applied as the drain-source voltage Vds, in a case where the energy barrier against electrons is sufficiently low, that is, where the threshold voltage is low, electrons flow from the n-type semiconductor region 22 toward the p-type semiconductor region 20 (arrow (1) in FIG. 8). As electrons flow, the energy barrier against holes of the semiconductor layer 24 facing the adjacent word line NWL decreases (arrow (2) in FIG. 8). Since the energy barrier against holes decreases, holes flow from the p-type semiconductor region 20 toward the n-type semiconductor region 22 (arrow (3) in FIG. 8). As holes flow, the energy barrier against electrons of the semiconductor layer 24 facing the selected word line SWL decreases (arrow (4) in FIG. 8).

Positive feedback is applied, and an electric current flowing between the drain and the source rises sharply. In other words, the thyristor operation occurs. Finally, the energy barrier against electrons and holes disappears, and current continues to flow.

Since the electric current flowing between the drain and the source rises sharply, the S factor of the memory cell MC decreases. Accordingly, data read characteristics of the memory cell MC are improved.

The threshold voltage at which the thyristor operation occurs depends on the amount of charge accumulated in the charge accumulation region CS of the memory cell MC. When the accumulated amount of electrons is large, the energy barrier against electrons under the selected word line SWL becomes high, so that the threshold voltage becomes high. In this case, the thyristor operation does not occur even if the read voltage Vref is applied to the selected word line SWL.

On the other hand, when the accumulated amount of electrons is small, the energy barrier against electrons under the selected word line SWL becomes low, so that the threshold voltage becomes low. In this case, the thyristor operation occurs by applying the read voltage Vref to the selected word line SWL.

By controlling the amount of charge accumulated in the charge accumulation region CS, the memory cell MC can hold 4-value data as shown in FIG. 4, for example.

Writing of data to the memory cell MC can be realized, for example, by maintaining the voltage of the word line WL at the program voltage Vprog as a positive voltage with respect to the semiconductor layer 24 and injecting electrons from the semiconductor layer 24 to the charge accumulation region CS.

Data erasing of the memory cell MC can be realized, for example, by maintaining the voltage of the word line WL at a negative erasing voltage Verase with respect to the semiconductor layer 24 and extracting electrons from the charge accumulation region CS to the semiconductor layer 24.

Next, write verify operation (program verify operation) of the three-dimensional NAND flash memory of the first embodiment will be described.

Figure 9A:
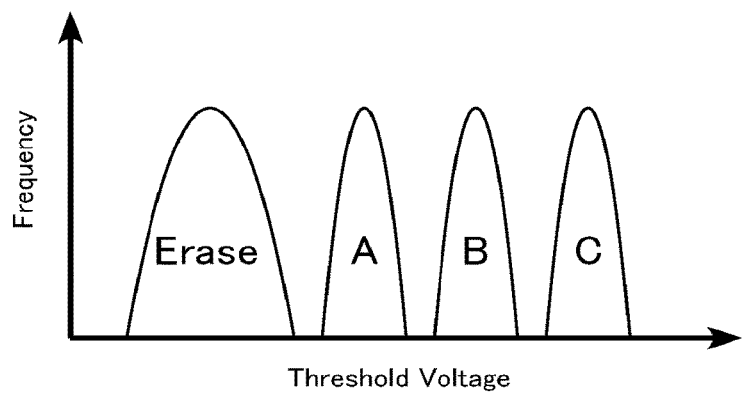
FIGS. 9A and 9B are explanatory diagrams of a write verify operation of the semiconductor memory device of the first embodiment.
Figure 9B:
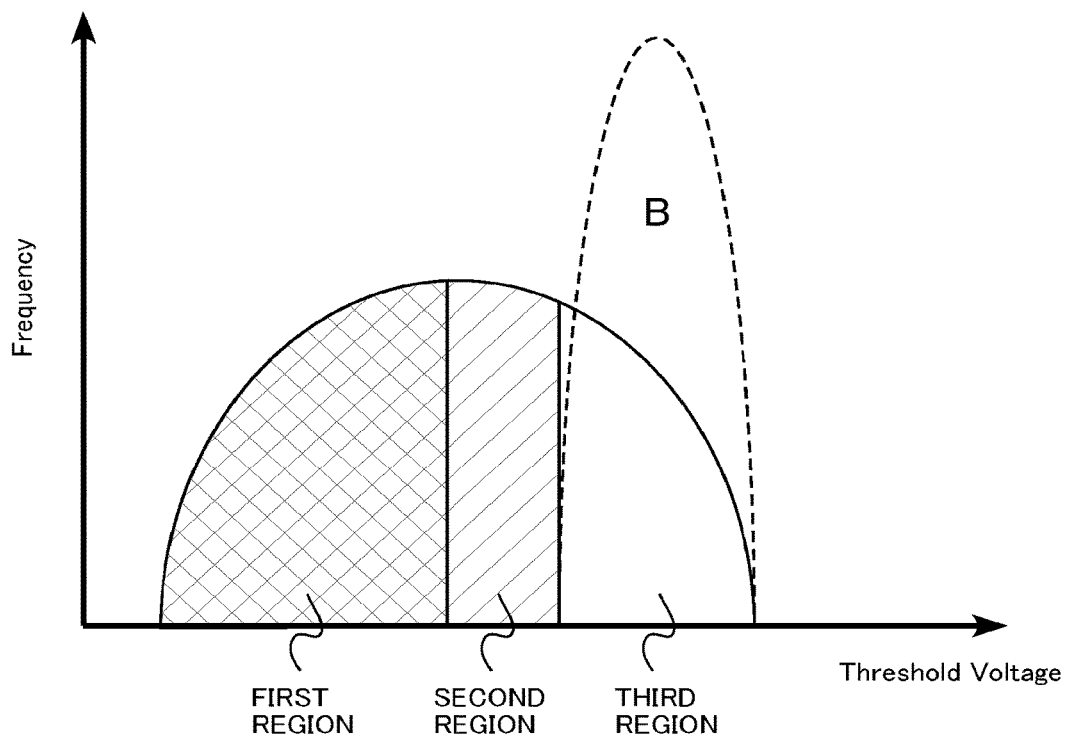

FIGS. 9A and 9B are explanatory diagrams of the write verify operation of the semiconductor memory device of the first embodiment.

As shown in FIG. 9A, in the three-dimensional NAND flash memory of the first embodiment, for example, one memory cell MC stores four values. Among four threshold voltage distributions shown in FIG. 9A, FIG. 9B shows the threshold voltage distribution when the write verify operation aiming at writing the threshold voltage distribution B is performed.

The memory cell MC existing in the third region has already reached the threshold voltage distribution B. On the other hand, the memory cells MC existing in the first region and the second region are cells which should originally be written in the threshold voltage distribution B. However, since the cells have not yet reached the threshold voltage distribution B, the program voltage is applied also in the next program loop.

Here, in the memory cell MC existing in the first region, the threshold voltage rises up to the third region upon the next and subsequent applications of the program voltage Vprog, and the writing is completed. However, when the normal program voltage Vprog is applied to the memory cell MC existing in the second region, there is a possibility that so-called over-programming beyond the third region may occur. When the over-programming occurs, during the read operation, there may occur an erroneous determination that the memory cell MC which should originally be determined as the threshold voltage distribution B is determined as the threshold voltage distribution C having a higher threshold voltage.

In order to prevent over programming, a step-up value of the program voltage Vprog to be applied may be reduced. However, in this case, the number of program loops counted until the write verify operation is terminated increases, which causes a problem that the time required for the write verify operation increases.

FIGS. 10A, 10B and 10C are timing charts of a verify operation of the semiconductor memory device of the first embodiment.

FIG. 10A is the timing chart of the source select gate line SGS, the drain select gate line SGD, and the drain-source voltage Vds. FIG. 10B is the timing chart of the lower word line LWL and the upper word line UWL. FIG. 10C is the timing chart of the selected word line SWL and the adjacent word line NWL.

When verifying whether or not the memory cell MC has reached a desired threshold voltage, a first verify operation and a second verify operation are performed. In the pre-charge step and the off step, similar voltages are applied at the same timing as the read operation shown in FIGS. 6A, 6B, and 6C, except for the drain-source voltage Vds. The first verify operation and the second verify operation are executed by the control circuit.

The first verify operation and the second verify operation are performed during a program operation aiming at writing a desired threshold voltage to the memory cell MC.

In the first verify operation, the first voltage VdsL is applied as the drain-source voltage Vds. In the second verify operation, the second voltage VdsH is applied as the drain-source voltage Vds. The first voltage VdsL and the second voltage VdsH are different voltages. The first voltage VdsL is lower than the second voltage VdsH.

For example, the second voltage VdsH is the same voltage as the drain-source voltage Vds during normal read operation. A difference between the second voltage VdsH and the first voltage VdsL is, for example, 0.5V or more.

For example, by changing the voltage applied to the p-type semiconductor region 20 between the first verify operation and the second verify operation, the drain-source voltage Vds is changed from the first voltage VdsL to the second voltage VdsH.

In the first verify operation and the second verify operation, a verify voltage Vvrfy is applied to the selected word line SWL.

In the first verify operation, a first threshold voltage determination for determining PASS/FAIL at the first voltage VdsL of the memory cell MC is performed. In the second verify operation, a second threshold voltage determination for determining PASS/FAIL at the second voltage VdsH of the memory cell MC is performed.

Figure 11:
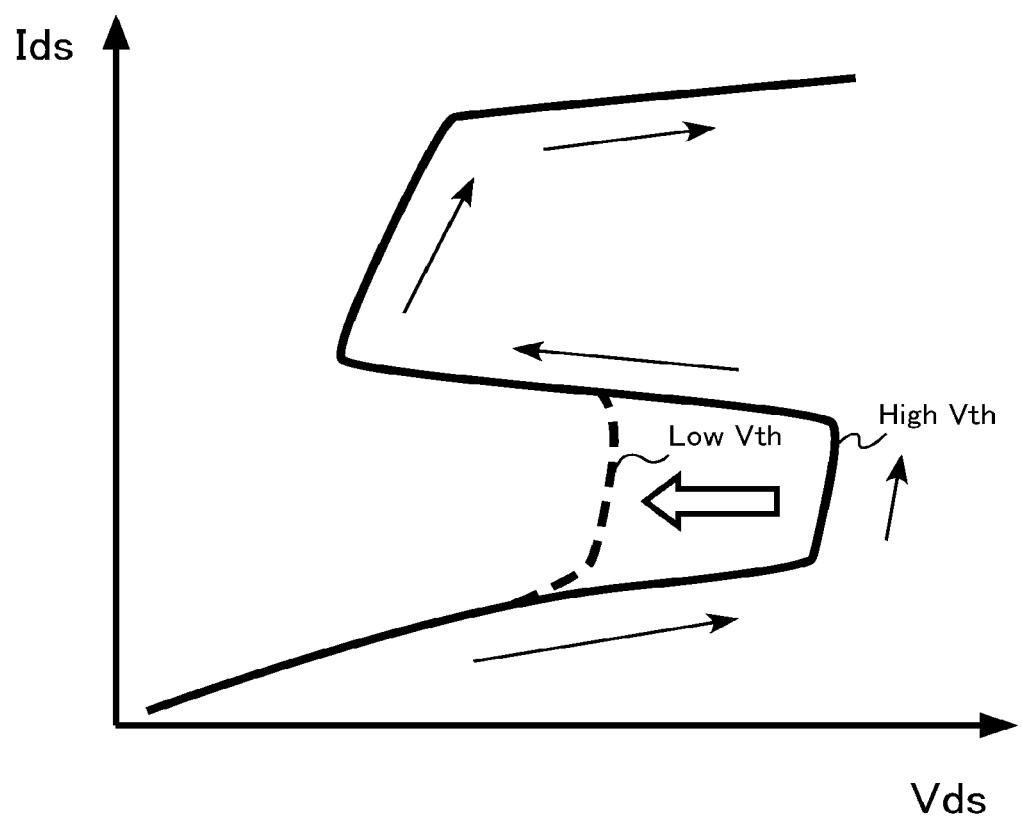
FIG. 11 is an explanatory diagram of snapback characteristics of the semiconductor memory device of the first embodiment.

FIG. 11 is an explanatory diagram of snapback characteristics of the semiconductor memory device of the first embodiment. In FIG. 11, the horizontal axis represents the drain-source voltage Vds, and the vertical axis represents a drain-source current Ids.

As a result of examination by the inventor, it has become clear that in the memory cell MC of the positive feedback type, as the drain-source voltage Vds is increased, the drain-source current Ids exhibits the snapback characteristics. Further, it has become clear that the drain-source voltage Vds at which snapback occurs depends on the threshold voltage of the memory cell MC. That is, in the memory cell MC (Low Vth) having a low threshold voltage, it has become clear that the drain-source voltage Vds causing snapback is lower than the memory cell MC (High Vth in FIG. 11) having a high threshold voltage.

Figure 12:
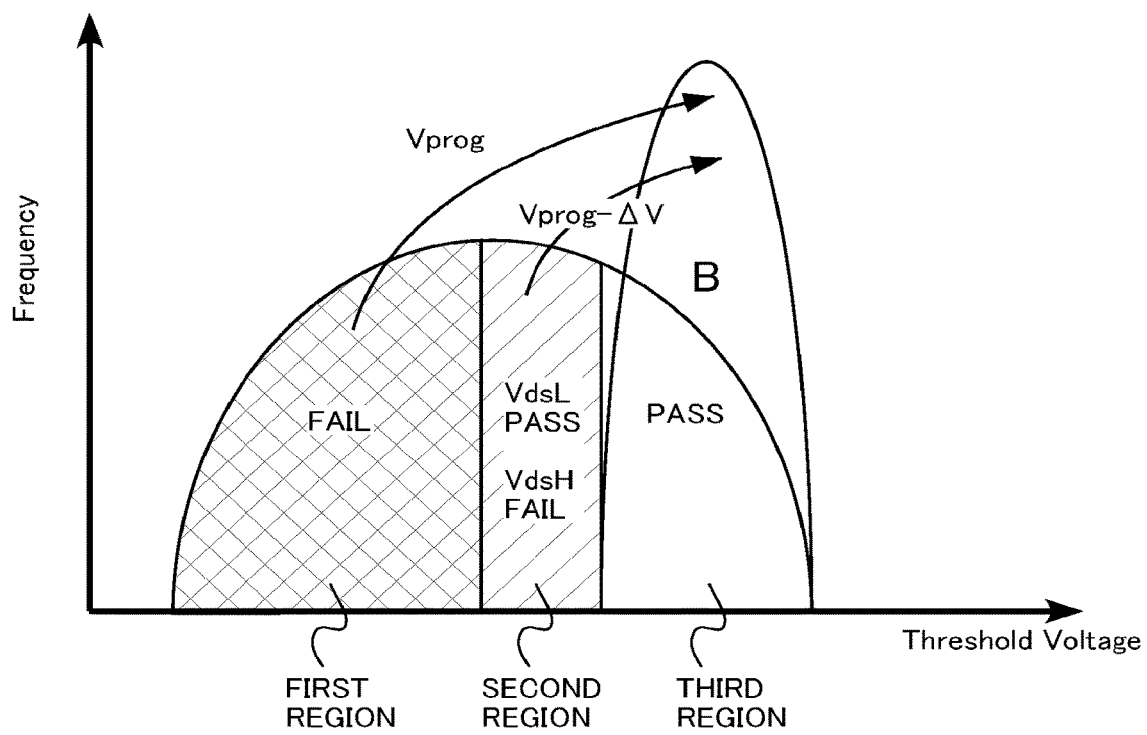
FIG. 12 is an explanatory diagram of the write verify operation of the semiconductor memory device of the first embodiment.

FIG. 12 is an explanatory diagram of the write verify operation of the semiconductor memory device of the first embodiment. Among four threshold voltage distributions shown in FIG. 9A, FIG. 12 shows the threshold voltage distribution when the write verify operation aiming at writing the threshold voltage distribution B is performed.

The memory cell MC existing in the first region where the threshold voltage is significantly lower than the desired threshold voltage distribution B fails in any of the first threshold voltage determination of the first verify operation and the second threshold voltage determination of the second verify operation. On the other hand, although the memory cell MC existing in the second region where the threshold voltage is slightly lower than the threshold voltage distribution B passes in the first threshold voltage determination, snapback occurs in the second threshold voltage determination where the drain-source voltage Vds is high, so that an electric current flows, and the memory cell MC fails. Accordingly, the memory cell MC existing in the first region and the memory cell MC existing in the second region can be separated from each other by performing the first verify operation and the second verify operation in which the drain-source voltage Vds is changed.

In the memory cell MC existing in the first region, the normal program voltage Vprog is applied in the next and subsequent program loops, the threshold voltage rises up to the third region, and the writing is completed. In the memory cell MC existing in the second region, a program voltage (Vprog-ΔV) lower than the normal program voltage Vprog is applied in the next program loop, the threshold voltage rises up to the third region without over-programming, and the writing is completed.

Through the write verify operation described above, it is possible to narrow the width of the threshold voltage distribution of the memory cell MC while suppressing an increase in time required for the write verify operation.

Figure 13:
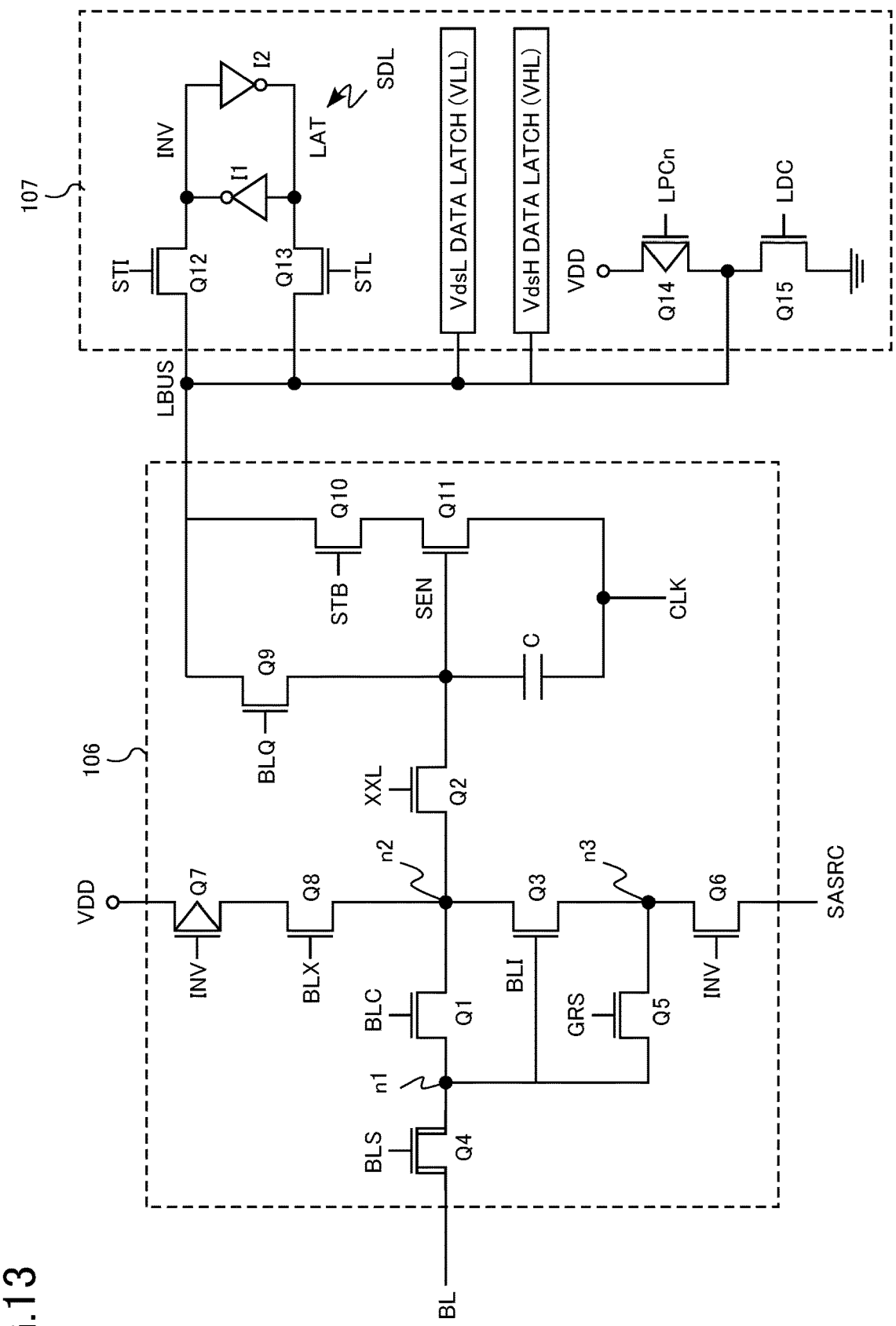
FIG. 13 is a diagram showing an example of a sense amplifier circuit and a latch circuit of the semiconductor memory device of the first embodiment.

FIG. 13 is a diagram showing an example of a sense amplifier circuit and a latch circuit of the semiconductor memory device of the first embodiment. FIG. 13 is an example of the sense amplifier circuit 106 and the latch circuit 107 shown in the block diagram of FIG. 1.

The sense amplifier circuit 106 includes first and second transistors Q1 and Q2 cascode-connected between the bit line BL and a SEN node and a third transistor Q3 connected between a second node n2 between these first and second transistors Q1 and Q2 and a SASRC node.

A gate of the third transistor Q3 is connected to a first node n1, together with a drain of the first transistor Q1. A fourth transistor Q4 is connected to a current path between the first node n1 and the bit line BL. This fourth transistor Q4 is a high-breakdown voltage transistor provided to electrically isolate the bit line BL from the first node n1 when, for example, the memory cell MC is erased. Additionally, a PMOS transistor Q7 is disposed between a VDD node and the second node n2.

A drain of the second transistor Q2 is a SEN node, and one end of a capacitor C is connected to the SEN node. This SEN node is a sense node that charges and discharges the capacitor C depending on logic of the data read from the memory cell MC.

The controller 8 in FIG. 1 controls the first to fourth transistors Q1 to Q4 and the transistor Q7 to switch between on and off. All of the first to fourth transistors Q1 to Q4 are n-channel MOS transistors.

The sense amplifier circuit 106 has fifth to eleventh transistors Q5 to Q11. The latch circuit 107 has twelfth to fifteenth transistors Q12 to Q15, a sense data latch SDL, a VdsL data latch VLL, and a VdsH data latch VHL.

The fifth transistor Q5 is connected between the gate and the source of the third transistor Q3. The fifth transistor Q5 is provided to flow an electric current flowing from the bit line BL to a third node n3 without passing through the first and second transistors Q1 and Q2 during data writing to the memory cell MC. The fifth transistor Q5 is switched between on and off by a GRS signal.

The sixth transistor Q6 is disposed between a source of the third transistor Q3 and the SASRC node, and switched between on and off by an INV signal.

The seventh transistor Q7 and the eighth transistor Q8 are cascode-connected between a power supply voltage node VDD and the second node n2. The seventh transistor Q7 is switched between on and off by the INV signal, and the eighth transistor Q8 is switched between on and off by a BLX signal.

The ninth transistor Q9 is disposed between an LBUS node and the SEN node, and switched between on and off by a BLQ signal. The tenth transistor Q10 and the eleventh transistor Q11 are cascode-connected between the LBUS node and a CLK node. The tenth transistor Q10 is switched between on and off by an STB signal.

The twelfth transistor Q12 is disposed between the LBUS node and an input node of the latch circuit 107 and switched between on and off by an STI signal. The thirteenth transistor Q13 is disposed between the LBUS node and an output node of the sense data latch SDL and switched between on and off by an STL signal.

The fourteenth transistor Q14 and the fifteenth transistor Q15 are cascode-connected between the power supply voltage node VDD and a ground node. The fourteenth transistor Q14 and the fifteenth transistor Q15 operate as a controller that forcefully inverts logic of the latch data of the sense data latch SDL, the VdsL data latch, and the VdSH data latch. The fourteenth transistor Q14 is switched between on and off by an LPCn signal, whereas the fifteenth transistor Q15 is switched between on and off by an LDC signal.

The seventh transistor Q7 and the fourteenth transistor Q14 are p-channel MOS transistors, while the other transistors are n-channel MOS transistors.

The INV signals input to gates of the sixth and seventh transistors Q6 and Q7 are signals with logic similar to that of latch data INV in the sense data latch SDL.

FIG. 13 depicts an example where a BLC signal is supplied to a gate of the first transistor Q1, an XXL signal is supplied to a gate of the second transistor Q2, a BLI signal is supplied to the gate of the third transistor Q3, a BLS signal is supplied to the gate of the fourth transistor Q4, and the GRS signal is supplied to a gate of the fifth transistor Q5.

The VdsL data latch VLL holds the result of the first threshold voltage determination during the verify operation. The VdsH data latch VHL holds the result of the second threshold voltage determination during the verify operation.

Figure 14:
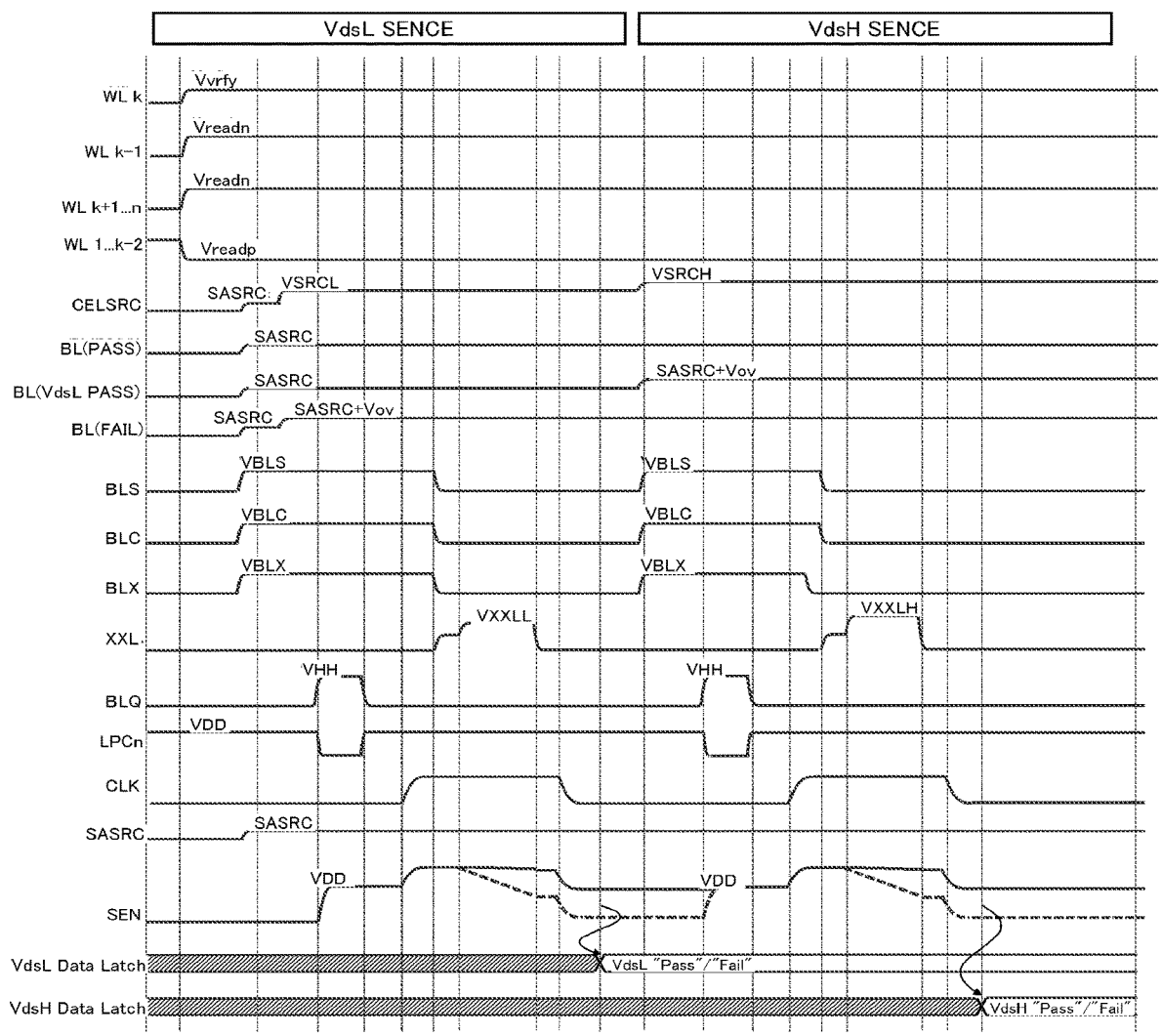
FIG. 14 is a signal waveform diagram showing the verify operation of the semiconductor memory device of the first embodiment.

FIG. 14 is a signal waveform diagram showing the verify operation of the semiconductor memory device of the first embodiment. By varying CELSRC applied to the p-type semiconductor region 20, the drain-source voltage Vds changes from the first voltage VdsL to the second voltage VdsH.

The first voltage VdsL is a difference between VSRCL and SASRC. The second voltage VdsH is a difference between VSRCH and SASRC.

Although the case the drain-source voltage Vds of the verify operation is changed by changing the voltage applied to the p-type semiconductor region 20 been described as an example, the drain-source voltage Vds of the verify operation can be changed by changing the voltage of the n-type semiconductor region 22, that is, the voltage of the bit line BL.

In the three-dimensional NAND flash memory, for example, a large number of plate-shaped word lines WL are stacked with the interlayer insulating layer 12 interposed between the word lines WL. Thus, the capacity of the word line WL is large.

For example, it is conceivable to perform the write verify operation while changing a voltage level of the word line WL in two stages. However, in the three-dimensional NAND flash memory, since the capacity of the word line WL is large, it may be difficult to speed up the write verify operation. The write verify operation of the three-dimensional NAND flash memory of the first embodiment changes the voltage of the semiconductor layer 24 having a smaller capacity than the word line WL. Accordingly, it is possible to speed up the write verify operation of the three-dimensional NAND flash memory.

As described above, according to the semiconductor memory device of the first embodiment, by the write verify operation using the snapback characteristics of the memory cell MC of the positive feedback type, it is possible to narrow the width of the threshold voltage distribution of the memory cell MC while suppressing an increase in time required for the write verify operation. In addition, it is possible to speed up the write verify operation.

Second Embodiment

The semiconductor memory device of the second embodiment is different from the semiconductor memory device of the first embodiment in that a p-type first semiconductor region is provided so as to interpose an insulating layer between itself and a semiconductor substrate. Hereinafter, some contents overlapping with the first embodiment are not described.

Figure 15:
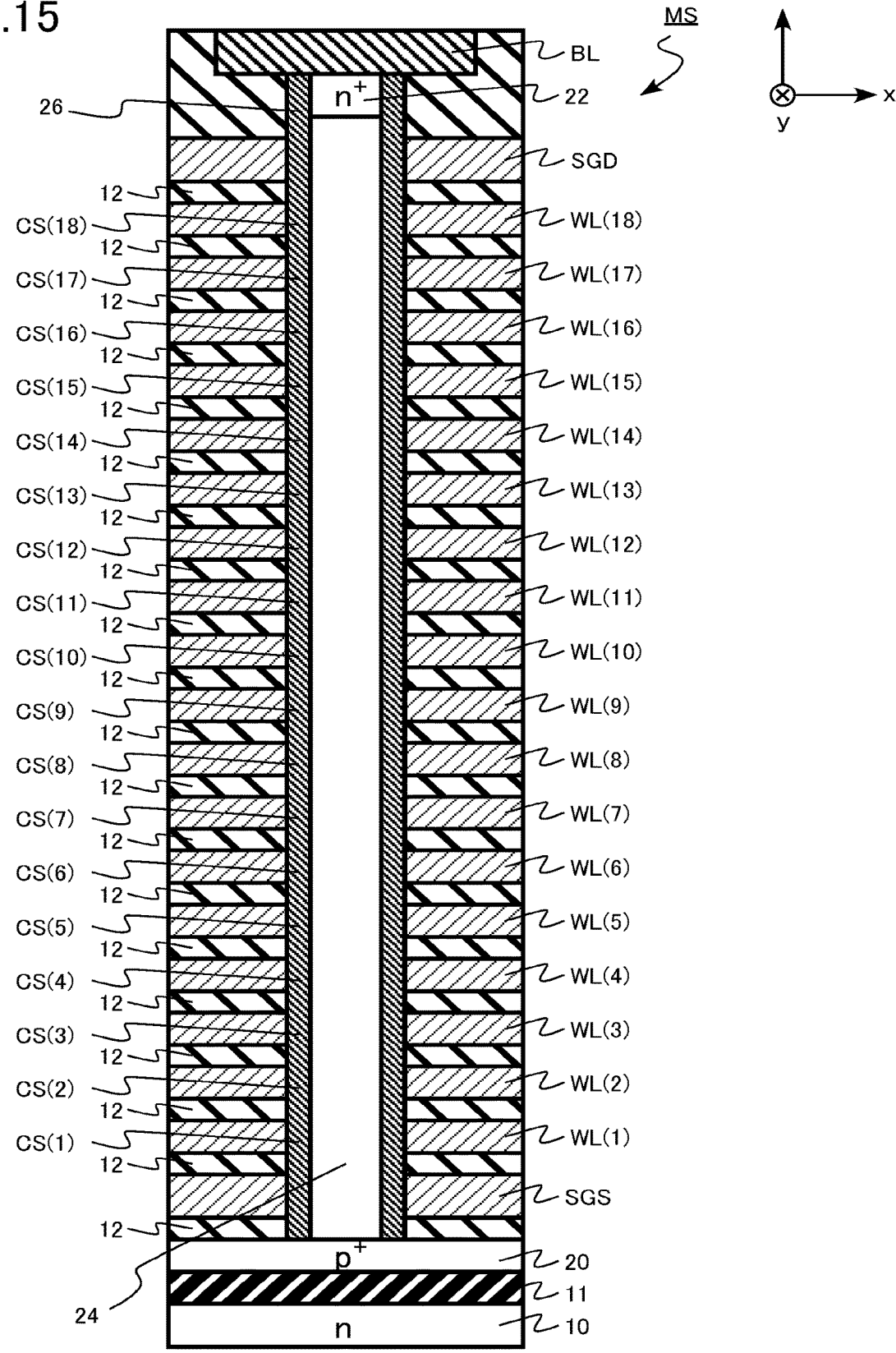
FIG. 15 is a schematic cross-sectional view of a memory string of a semiconductor memory device of a second embodiment.

FIG. 15 is a schematic cross-sectional view of a memory string MS of the semiconductor memory device of the second embodiment.

The semiconductor memory device of the second embodiment is a three-dimensional NAND flash memory in which memory cells are three-dimensionally disposed. The semiconductor memory device of the second embodiment is a positive feedback type three-dimensional NAND flash memory in which a p-type semiconductor region is provided at one end of the memory string MS.

FIG. 15 is a schematic cross-sectional view of one memory string MS. FIG. 15 illustrates a case where the number of the word lines WL is eighteen, that is, n=18.

The memory string MS includes a semiconductor substrate 10, an insulating layer 11, an interlayer insulating layer 12, eighteen word lines WL(1) to WL(18) from the first to the eighteenth, a p-type semiconductor region 20 (first semiconductor region), an n-type semiconductor region 22 (second semiconductor region), a semiconductor layer 24, a charge accumulation film 26, a bit line BL, a source select gate line SGS, and a drain select gate line SGD. The charge accumulation film 26 includes first to eighteenth charge accumulation regions CS(1) to CS(18).

The semiconductor substrate 10 is, for example, a single-crystal n-type silicon substrate. The semiconductor substrate 10 contains, for example, phosphorus (P) as an n-type impurity.

The insulating layer 11 is provided on the semiconductor substrate 10. The insulating layer 11 is, for example, silicon oxide.

The p-type semiconductor region 20 is provided on the insulating layer 11. The p-type semiconductor region 20 is, for example, polycrystalline silicon containing a p-type impurity. The p-type impurity is, for example, boron (B). The p-type impurity concentration of the p-type semiconductor region 20 is, for example, $1\times10^{20}$ cm$^{-3}$ or more. The p-type semiconductor region 20 functions as a common source line CSL.

Since the other configurations are the same as those of the semiconductor memory device of the first embodiment, the descriptions thereof are omitted.

In the three-dimensional NAND flash memory of the second embodiment, the p-type semiconductor region 20 is provided on the semiconductor substrate 10 through the insulating layer 11. Thus, for example, a control circuit such as a row decoder 103, a word line driver 104, a column decoder 105, a sense amplifier circuit 106, a data latch circuit 107, a controller 108, a high voltage generator 109, an address register 110 or a command decoder 111 can be formed on the semiconductor substrate 10 under a memory cell array 101. Accordingly, it is possible to reduce the chip size of the three-dimensional NAND flash memory.

As described above, according to the semiconductor memory device of the second embodiment, as in the first embodiment, it is possible to narrow the width of the threshold voltage distribution of the memory cell MC while suppressing an increase in time required for the write verify operation. In addition, it is possible to speed up the write verify operation. Moreover, the chip size can be reduced.

Third Embodiment

A semiconductor memory device of a third embodiment includes a first semiconductor region of n-type, n word lines from a first word line to a nth word line stacked on the first semiconductor region in a first direction; a second semiconductor region of p-type, a semiconductor layer provided between the first semiconductor region and the second semiconductor region, the semiconductor layer extending in the first direction, and the semiconductor layer intersecting with the n word lines; ¥, a bit line electrically connected to the second semiconductor region. And the semiconductor memory device includes a control circuit controlling a first verify operation and a second verify operation following the first verify operation when verifying whether or not a kth (4<k<n) memory cell provided in a region where a kth word line and the semiconductor layer intersect with each other has reached a desired threshold voltage, the first verify operation applying a first voltage between the first semiconductor region and the second semiconductor region, and the second verify operation applying a second voltage different from the first voltage between the first semiconductor region and the second semiconductor region.

The semiconductor memory device of the third embodiment is different from the semiconductor memory device of the first embodiment in that the n-type first semiconductor region and the p-type second semiconductor region are reversely positioned. Hereinafter, some contents overlapping with the first embodiment may not be described.

Figure 16:
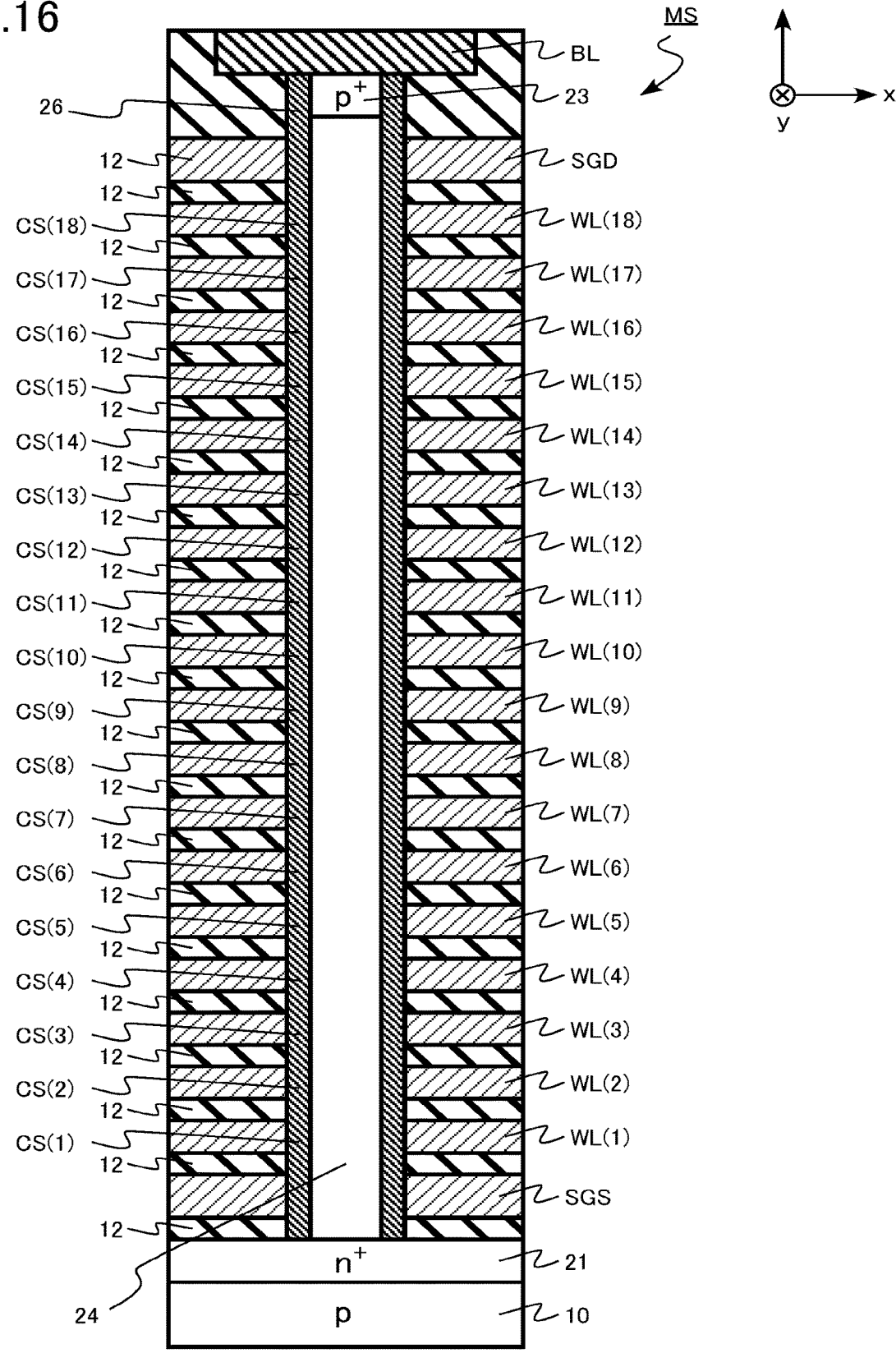
FIG. 16 is a schematic cross-sectional view of a memory string of a semiconductor memory device of a third embodiment.

FIG. 16 is a schematic cross-sectional view of a memory string MS of the semiconductor memory device of the third embodiment.

The semiconductor memory device of the third embodiment is a three-dimensional NAND flash memory in which memory cells are three-dimensionally disposed. The semiconductor memory device of the third embodiment is a positive feedback type three-dimensional NAND flash memory in which a p-type semiconductor region is provided at one end of the memory string MS.

FIG. 16 is a schematic cross-sectional view of one memory string MS. FIG. 16 illustrates a case where the number of the word lines WL is eighteen, that is, n=18.

The memory string MS includes a semiconductor substrate 10, an interlayer insulating layer 12, eighteen word lines WL(1) to WL(18) from the first to the eighteenth, an n-type semiconductor region 21 (first semiconductor region), a p-type semiconductor region 23 (second semiconductor region), a semiconductor layer 24, a charge accumulation film 26, a bit line BL, a source select gate line SGS, and a drain select gate line SGD. The charge accumulation film 26 includes first to eighteenth charge accumulation regions CS(1) to CS(18).

The semiconductor substrate 10 is, for example, a single-crystal p-type silicon substrate. The semiconductor substrate 10 contains, for example, boron (B) as a p-type impurity.

The n-type semiconductor region 21 is provided in the semiconductor substrate 10. The n-type semiconductor region 21 contains an n-type impurity. The n-type impurity is, for example, phosphorus (P) or arsenic (As). The n-type impurity concentration of the n-type semiconductor region 21 is, for example, $1\times10^{19}$ cm$^{-3}$ or more.

The p-type semiconductor region 23 is provided on the bit line BL side of the semiconductor layer 24. The p-type semiconductor region 23 is, for example, polycrystalline silicon containing a p-type impurity. The p-type impurity is, for example, boron (B). The p-type impurity concentration of the p-type semiconductor region 23 is, for example, $1\times10^{19}$ cm$^{-3}$ or more.

The word line WL is provided on the semiconductor substrate 10. The word line WL is provided on the n-type semiconductor region 21. The word line WL is, for example, a plate-like conductive layer. The interlayer insulating layer 12 is provided between the word lines WL. The word lines WL are stacked in the z direction (first direction). The word lines WL(1) to WL(18) function as control electrodes of the respective memory cells MC(1) to MC(18).

The word line WL is, for example, polycrystalline silicon containing a conductive impurity. Further, the word line WL is, for example, a metal. The interlayer insulating layer 12 is, for example, silicon oxide.

The semiconductor layer 24 is provided between the n-type semiconductor region 21 and the p-type semiconductor region 23. The semiconductor layer 24 is electrically connected to the n-type semiconductor region 21 and the p-type semiconductor region 23. The semiconductor layer 24 is in contact with the n-type semiconductor region 21 and the p-type semiconductor region 23. The semiconductor layer 24 penetrates through the eighteen word lines WL(1) to WL(18). The semiconductor layer 24 extends in the z direction. The semiconductor layer 24 has, for example, a columnar or cylindrical shape. The semiconductor layer 24 is surrounded by the word lines WL(1) to WL(18).

The bit line BL is electrically connected to the p-type semiconductor region 23. The bit line BL is, for example, in contact with the p-type semiconductor region 23. The bit line BL has a function of transmitting data read from the memory cell MC. Further, the bit line BL has a function of transmitting data to be written to the memory cell MC. The bit line BL is, for example, a metal.

For example, a ground potential is applied to a common source line CSL. The n-type semiconductor region 21 corresponds to the common source line CSL.

Next, an operation of the three-dimensional NAND flash memory of the third embodiment will be described. First, a write operation (program operation), a read operation, and an erase operation will be described. Particularly, a characteristic read operation in the positive feedback type three-dimensional NAND flash memory will be described in detail.

Figure 17:
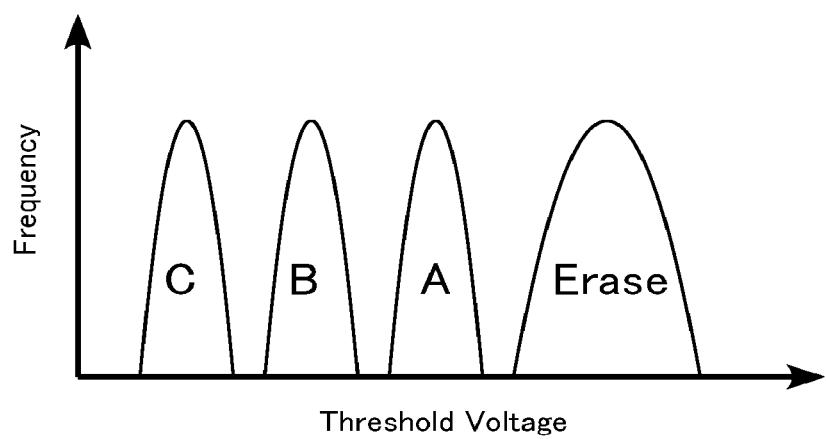
FIG. 17 is an explanatory diagram of the threshold voltage distribution of a memory cell written in the semiconductor memory device of the third embodiment.

FIG. 17 is an explanatory diagram of the threshold voltage distribution of the memory cell written in the semiconductor memory device of the third embodiment. The three-dimensional NAND flash memory of the third embodiment is, for example, a 4-value memory cell in which one memory cell MC stores four values. One memory cell MC stores 2 bits.

In FIG. 17, the horizontal axis represents a threshold voltage of the memory cell MC, and the vertical axis represents the frequency of the threshold voltage. The number of threshold voltage distributions of the 4-value memory cell is four.

One of the threshold voltage distributions is an erase cell distribution ("Erase" in FIG. 17) to which the memory cell MC in the erase state belongs. The other memory cells MC are separately programmed into three threshold voltage distributions in the course of data write operation (program operation). The three threshold voltage distributions are realized by changing the magnitude of the program voltage (Vprog) applied between the word line WL and the semiconductor layer 24 in the write operation.

Hereinafter, these three threshold voltage distributions will be referred to respectively as a threshold voltage distribution A, a threshold voltage distribution B, and a threshold voltage distribution C in order from the side closer to the erase cell distribution.

In the third embodiment, for example, in the write operation, holes are injected into the charge accumulation region CS by making the voltage on the word line WL side relatively negative with respect to the semiconductor layer 24 side. Accordingly, in the threshold voltage distribution A, the threshold voltage distribution B, and the threshold voltage distribution C, there is a memory cell MC having a low threshold voltage with respect to the erase cell distribution Erase.

Figure 18:
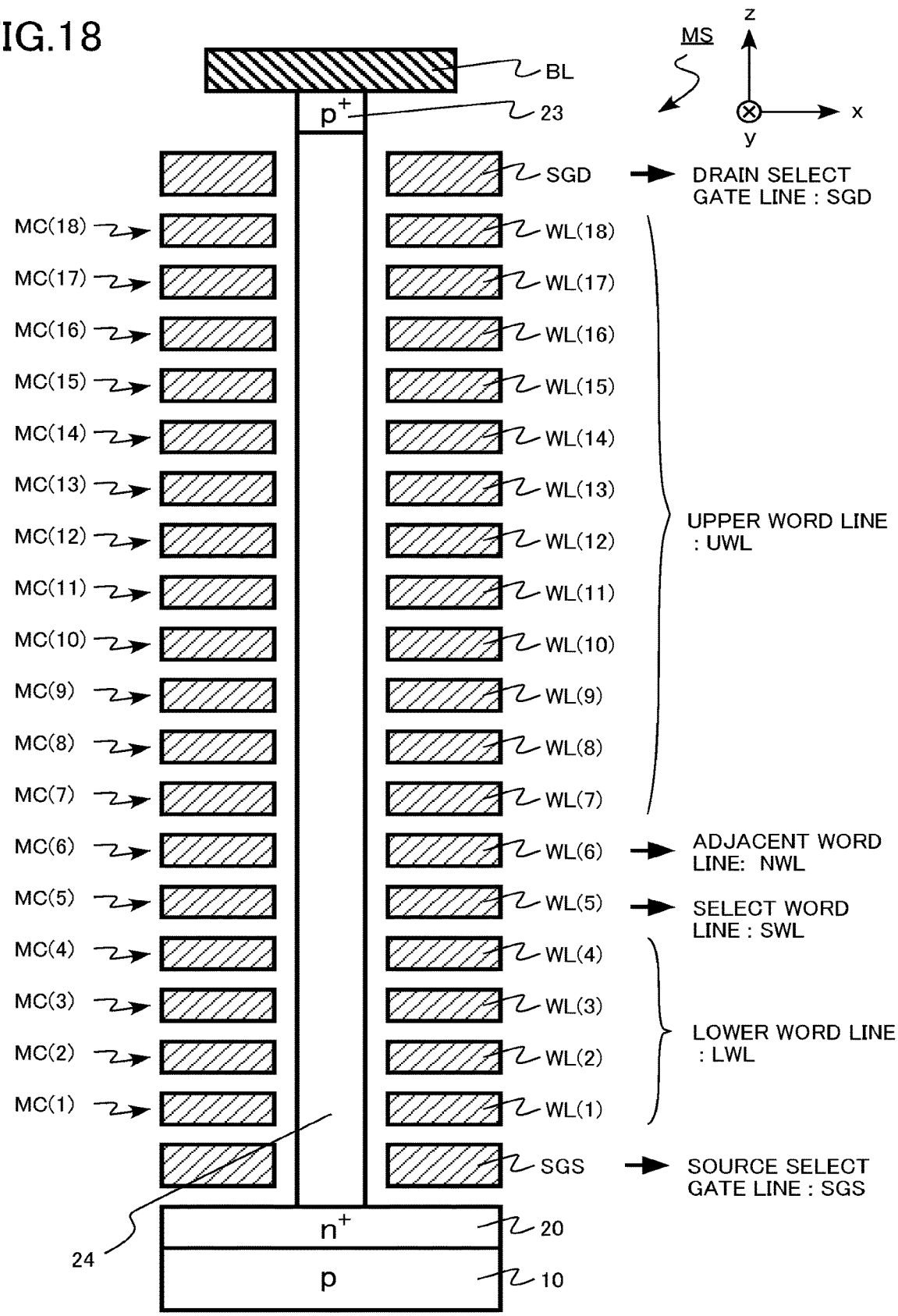
FIG. 18 is a schematic diagram illustrating the data read operation of the semiconductor memory device of the third embodiment.

FIG. 18 is a schematic diagram illustrating the data read operation of the semiconductor memory device of the third embodiment. FIGS. 19A, 19B and 19C are timing charts of the data read operation of the semiconductor memory device of the third embodiment.

For example, when reading data based on the charge amount in the kth (2<k<n−2) charge accumulation region, the control circuit applies a positive voltage to the first to (k−1)th word lines WL, applies a negative voltage to the (k+2)th to nth word lines WL, applies a positive voltage to a (k+1)th conductive layer, and applies a read voltage to a kth conductive layer.

FIG. 18 shows the designation of each layer and each region. Hereinafter, a case where data of the memory cell MC controlled by selected word line SWL is read will be described as an example. In particular, the case of reading data of the memory cell MC(5), that is, the case where k=5 will be described as an example.

The selected word line SWL corresponds to the word line WL(5). An adjacent word line NWL adjacent to the selected word line SWL corresponds to the word line WL(6). A lower word line LWL corresponds to the word lines WL(1) to WL(4). An upper word line UWL corresponds to the word lines WL(7) to WL(18).

As shown in FIGS. 19A, 19B, and 19C, the read operation for reading data of the memory cell MC includes a precharge step, an off step, and a read step. The voltage value shown in FIG. 19 is an example of a voltage value applied to each layer or each region.

FIG. 19A is the timing chart of the source select gate line SGS, the drain select gate line SGD, and the drain-source voltage Vds. FIG. 19B is the timing chart of the lower word line LWL and the upper word line UWL. FIG. 19C is the timing chart of the selected word line SWL and the adjacent word line NWL. For example, the n-type semiconductor region 21 is always fixed to the ground potential, that is, 0 V. The drain-source voltage Vds is a voltage applied between the n-type semiconductor region 21 and the p-type semiconductor region 23.

The precharge step is a step for initializing a state of the memory cell MC before the read step. By the precharge step, for example, the instability of the read operation is eliminated. The precharge step may be omitted.

In the precharge step, a positive voltage is applied to the source select gate line SGS and the lower word line LWL. A positive voltage Vreadn is applied to the lower word line LWL. A positive voltage Vreadn is applied to the selected word line SWL.

A negative voltage is applied to the drain select gate line SGD and the upper word line UWL. A negative voltage Vreadp is applied to the upper word line UWL. 0 V is applied to the adjacent word line NWL. The drain-source voltage Vds is 0 V (Ta in FIGS. 19A, 19B, and 19C).

In the precharge step, electrons are accumulated in the semiconductor layer 24 facing the source select gate line SGS, the lower word line LWL, and the selected word line SWL to be made to have n-type conductivity. Holes are accumulated in the semiconductor layer 24 facing the drain select gate line SGD and the upper word line UWL to be made to have p-type conductivity.

The off step is a step for forming an energy barrier against charges in the semiconductor layer 24. When shifting from the precharge step to the off step, the voltage applied to the selected word line SWL is changed from the positive voltage Vreadn to a read voltage Vref. (Tb in FIGS. 19A, 19B, and 19C).

The voltage applied to the selected word line SWL is set to the read voltage Vref, and the voltage applied to the adjacent word line NWL is made positive voltage, so that an energy barrier against charges is formed in the semiconductor layer 24 (Tc in FIGS. 19A, 19B, and 19C).

FIG. 20 is a schematic diagram illustrating the data read operation of the semiconductor memory device of the third embodiment. FIG. 20 is a schematic cross-sectional view showing an applied voltage and a state of the semiconductor layer 24 at a time Td of the read step. The voltage value shown in FIG. 20 is an example of a voltage value applied to each layer or each region.

As shown in FIG. 20, the voltage applied to the selected word line SWL is set to the read voltage Vref, whereby the semiconductor layer 24 facing the selected word line SWL is made to have p-type conductivity. On the other hand, the voltage applied to the adjacent word line NWL is set to the positive voltage Vreadn, whereby the semiconductor layer 24 facing the adjacent word line NWL is made to have n-type conductivity. Accordingly, a thyristor structure using a npnp structure is formed in the semiconductor layer 24 from the n-type semiconductor region 21 toward the p-type semiconductor region 23.

Hereinafter, among the memory cells MC belonging to the selected memory string MS, the memory cell MC having the selected word line SWL is referred to as a selected memory cell, and the memory cell having the adjacent word line NWL is referred to as an adjacent memory cell.

The read step is a step of actually reading the data of the memory cell MC. The drain-source voltage Vds increases from 0 V to a positive voltage. Here, a relatively high voltage with respect to the p-type semiconductor region 23 is applied to the n-type semiconductor region 21 (Td in FIGS. 19A, 19B, and 19C). When the energy barrier against the electrons of the semiconductor layer 24 facing the selected word line SWL is low, a thyristor operation occurs, and an electric current flows from the p-type semiconductor region 23 to the n-type semiconductor region 21.

Writing of data to the memory cell MC can be realized by, for example, maintaining the voltage of the word line WL at the program voltage Vprog as a negative voltage with respect to the semiconductor layer 24 and injecting holes from the semiconductor layer 24 to the charge accumulation region CS.

Data erasing of the memory cell MC can be realized, for example, by maintaining the voltage of the word line WL at a positive erasing voltage Verase with respect to the semiconductor layer 24 and extracting holes from the charge accumulation region CS to the semiconductor layer 24.

A write verify operation of the three-dimensional NAND flash memory of the third embodiment has a first verify operation and a second verify operation as in the first embodiment.

In the first verify operation, the first voltage VdsL is applied as the drain-source voltage Vds. In the second verify operation, the second voltage VdsH is applied as the drain-source voltage Vds. The first voltage VdsL and the second voltage VdsH are different voltages. The first voltage VdsL is lower than the second voltage VdsH. For example, the second voltage VdsH is the same voltage as the drain-source voltage Vds during normal read operation. A difference between the second voltage VdsH and the first voltage VdsL is, for example, 0.5V or more.

For example, by changing the voltage applied to the p-type semiconductor region 23 between the first verify operation and the second verify operation, the drain-source voltage Vds is changed from the first voltage VdsL to the second voltage VdsH. In other words, by changing the voltage applied to the bit line BL between the second verify operation and the first verify operation, the drain-source voltage Vds is changed from the first voltage VdsL to the second voltage VdsH.

In the first verify operation and the second verify operation, a verify voltage Vvrfy is applied to the selected word line SWL.

In the three-dimensional NAND flash memory of the third embodiment, as shown in FIG. 17, as holes are written in the charge accumulation region CS, the threshold voltage of the memory cell MC decreases. Accordingly, in the write verify operation, unlike the first embodiment, write-verify is performed toward a low threshold voltage distribution.

That is, in the verify operation, the memory cell MC through which an electric current flows is determined as PASS, and the memory cell MC in which the electric current does not flow is determined as FAIL. With respect to the cell determined as FAIL, holes are written in the charge accumulation region CS to lower the threshold voltage and thus to move to a desired threshold voltage distribution.

Also in the three-dimensional NAND flash memory of the third embodiment, as in the first embodiment, it is possible to narrow the width of the threshold voltage distribution of the memory cell MC while suppressing an increase in time required for the write verify operation.

Figure 21:
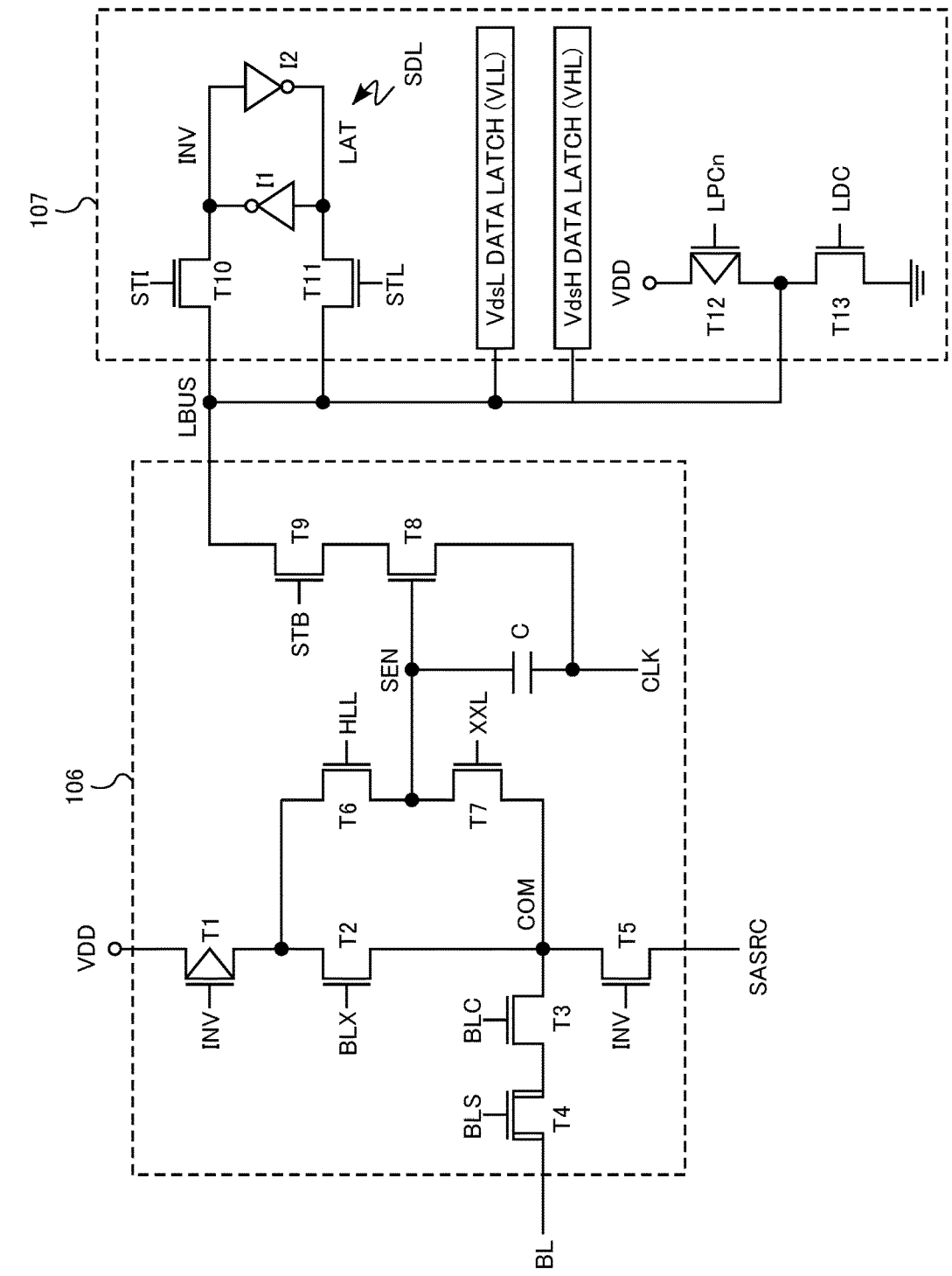
FIG. 21 is a diagram showing an example of a sense amplifier circuit and a latch circuit of the semiconductor memory device of the third embodiment.

FIG. 21 is a diagram showing an example of a sense amplifier circuit and a latch circuit of the semiconductor memory device of the third embodiment. FIG. 21 is an example of the sense amplifier circuit 106 and the latch circuit 107 shown in the block diagram of FIG. 1.

The sense amplifier circuit 106 and the latch circuit 107 are connected by a bus LBUS so that data can be mutually transmitted and received. The latch circuit 107 includes a sense data latch SDL, a VdsL data latch VLL, and a VdsH data latch VHL.

For example, in the read operation, the sense amplifier circuit 106 senses data read to the corresponding bit line BL and determines the value of the read data. The sense amplifier circuit 106 includes, for example, a p-channel MOS transistor T1, n-channel MOS transistors T2 to T9, and a capacitor C.

One end of the transistor T1 is connected to a power supply line, and a gate of the transistor T1 is connected to a node INV of the sense data latch SDL. One end of the transistor T2 is connected to the other end of the transistor T1, the other end of the transistor T2 is connected to a node COM, and a control signal BLX is input to a gate of the transistor T2. One end of the transistor T3 is connected to the node COM, and a control signal BLC is input to a gate of the transistor T3. The transistor T4 is a high-breakdown voltage transistor. One end of the transistor T4 is connected to one end of the transistor T3, the other end of the transistor T4 is connected to the corresponding bit line BL, and a control signal BLS is input to a gate of the transistor T4.

One end of the transistor T5 is connected to the node COM, the other end of the transistor T5 is connected to a node SASRC, and a gate of the transistor T5 is connected to the node INV. One end of the transistor T6 is connected to a node SEN, the other end of the transistor T6 is connected to the other end of the transistor T1, and a node HLL is input to a gate of the transistor T6. One end of the transistor T7 is connected to the node SEN, the other end of the transistor T7 is connected to the node COM, and a control signal XXL is input to a gate of the transistor T7.

A clock CLK is input to one end of the transistor T8, and a gate of the transistor T8 is connected to the node SEN. One end of the transistor T9 is connected to the other end of the transistor T8, the other end of the transistor T9 is connected to the bus LBUS, and a control signal STB is input to a gate of the transistor T9. One end of the capacitor C is connected to the node SEN, and the clock CLK is input to the other end of the capacitor C.

The control signals BLX, BLC, BLS, HLL, XXL, and STB described above are generated by, for example, a sequencer (not shown). A voltage VDD which is an internal power supply voltage of the semiconductor memory device 100 is applied to the power supply line connected to one end of the transistor T1, for example.

The sense data latch SDL, the VdsL data latch VLL, and the VdsH data latch VHL of the latch circuit 107 temporarily hold read data. The VdsL data latch VLL holds the result of a first threshold voltage determination during the verify operation. The VdsH data latch VHL holds the result of a second threshold voltage determination during the verify operation.

The sense data latch SDL includes, for example, inverters I1 and I2 and n channel MOS transistors T10 and T11. An input node of the inverter I1 is connected to a node LAT, and an output node of the inverter I1 is connected to the node INV. An input node of the inverter I2 is connected to the node INV, and an output node of the inverter I2 is connected to the node LAT.

One end of the transistor T10 is connected to the node INV, the other end of the transistor T10 is connected to the bus LBUS, and a control signal STI is input to a gate of the transistor T10. One end of the transistor T11 is connected to the node LAT, the other end of the transistor T11 is connected to the bus LBUS, and a control signal STL is input to a gate of the transistor T11.

The transistors T12 and T13 are cascode-connected between a power supply voltage node VDD and a ground node. The transistor T12 and the transistor T13 operate as a controller that forcefully inverts logic of the latch data of the sense data latch SDL, the VdsL data latch, and the VdSH data latch. The transistor T12 is switched between on and off by an LPCn signal, whereas the transistor T13 is switched between on and off by an LDC signal.

Figure 22:
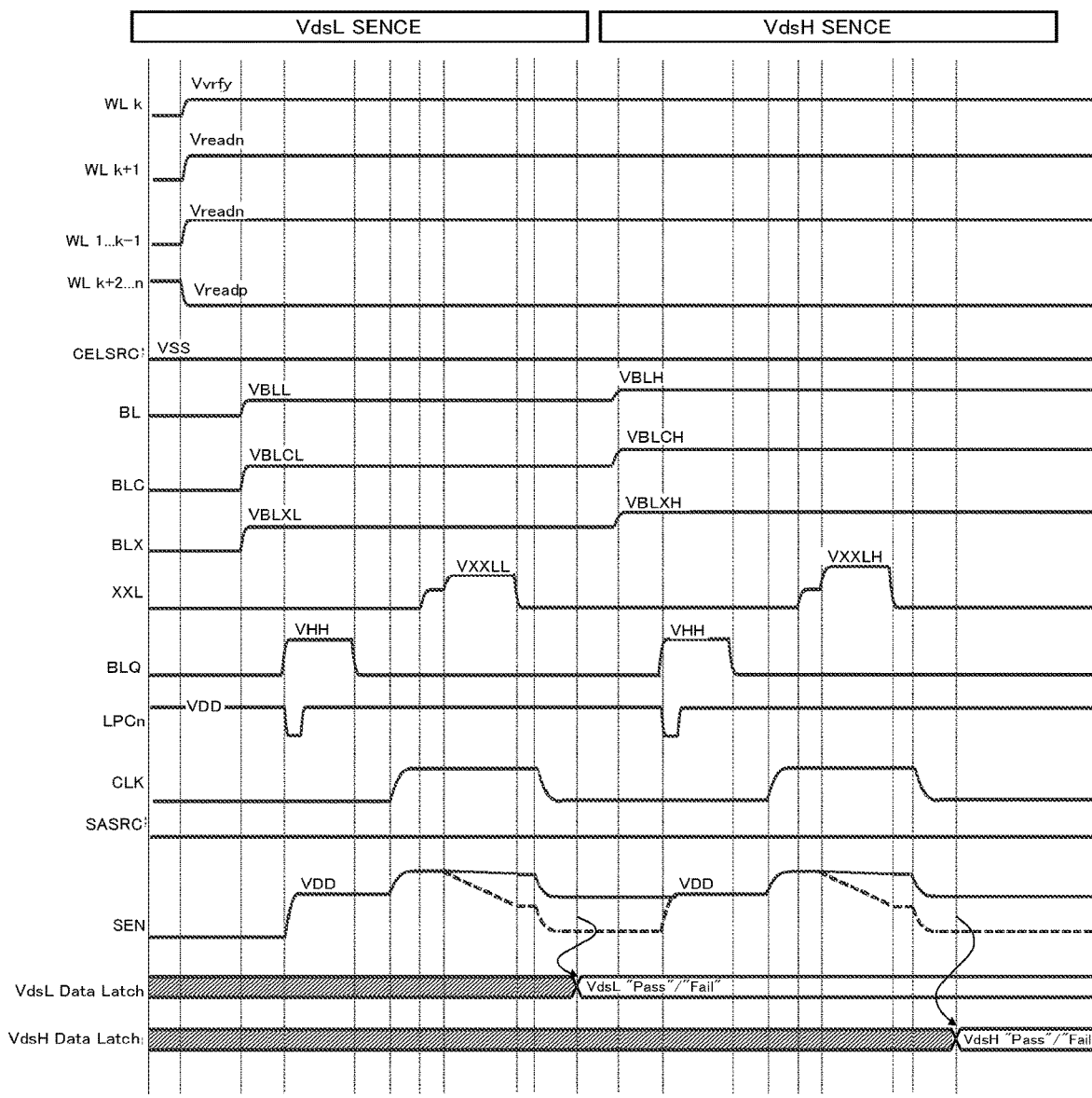
FIG. 22 is a signal waveform diagram showing the verify operation of the semiconductor memory device of the third embodiment.

FIG. 22 is a signal waveform diagram showing the verify operation of the semiconductor memory device of the third embodiment. By varying VBL applied to the bit line BL, the drain-source voltage Vds changes from the first voltage VdsL to the second voltage VdsH.

The first voltage VdsL is VBLL. The second voltage VdsH is VBLH.

As described above, according to the semiconductor memory device of the third embodiment, as in the first embodiment, it is possible to narrow the width of the threshold voltage distribution of the memory cell MC while suppressing an increase in time required for the write verify operation. In addition, it is possible to speed up the write verify operation.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first semiconductor region of p-type;
   n word lines from a first word line to an nth word line stacked on the first semiconductor region in a first direction;
   a second semiconductor region of n-type;
   a semiconductor layer provided between the first semiconductor region and the second semiconductor region, the semiconductor layer extending in the first direction, and the semiconductor layer intersecting with the n word lines;

a bit line electrically connected to the second semiconductor region; and a control circuit configured to perform a first verify operation and a second verify operation after the first verify operation, wherein, to verify whether or not a kth (4<k<n) memory cell provided in a region where a kth word line and the semiconductor layer intersect with each other has reached a desired threshold voltage, a first voltage is applied between the first semiconductor region and the second semiconductor region in the first verify operation, and a second voltage different from the first voltage is applied between the first semiconductor region and the second semiconductor region in the second verify operation.

2. The semiconductor memory device according to claim 1, wherein, in each of the first verify operation and the second verify operation, a negative voltage is applied to the first word line to a (k−2)th word line, a positive voltage is applied to a (k−1)th word line, and a positive voltage is applied to a (k+1)th to the nth word line.

3. The semiconductor memory device according to claim 1, wherein a voltage applied to the first semiconductor region is changed between the second verify operation and the first verify operation to change a voltage between the first semiconductor region and the second semiconductor region from the first voltage to the second voltage.

4. The semiconductor memory device according to claim 2, wherein a voltage applied to the first semiconductor region is changed between the second verify operation and the first verify operation to change a voltage between the first semiconductor region and the second semiconductor region from the first voltage to the second voltage.

5. The semiconductor memory device according to claim 1, wherein the first verify operation and the second verify operation are performed during a program operation aiming at writing the desired threshold voltage to the kth memory cell.

6. The semiconductor memory device according to claim 2, wherein the first verify operation and the second verify operation are performed during a program operation aiming at writing the desired threshold voltage to the kth memory cell.

7. The semiconductor memory device according to claim 3, wherein the first verify operation and the second verify operation are performed during a program operation aiming at writing the desired threshold voltage to the kth memory cell.

8. The semiconductor memory device according to claim 4, wherein the first verify operation and the second verify operation are performed during a program operation aiming at writing the desired threshold voltage to the kth memory cell.

9. A semiconductor memory device comprising:
a first semiconductor region of n-type;
n word lines from a first word line to an nth word line stacked on the first semiconductor region in a first direction;
a second semiconductor region of p-type;

a semiconductor layer provided between the first semiconductor region and the second semiconductor region, the semiconductor layer extending in the first direction, and the semiconductor layer intersecting with the n word lines;

a bit line electrically connected to the second semiconductor region; and a control circuit configured to perform a first verify operation and a second verify operation after the first verify operation, wherein, to verify whether or not a kth (4<k<n) memory cell provided in a region where a kth word line and the semiconductor layer intersect with each other has reached a desired threshold voltage, a first voltage is applied between the first semiconductor region and the second semiconductor region in the first verify operation, and a second voltage different from the first voltage is applied between the first semiconductor region and the second semiconductor region in the second verify operation.

10. The semiconductor memory device according to claim 9, wherein, in each of the first verify operation and the second verify operation, a positive voltage is applied to the first word line to a (k−1)th word line, a positive voltage is applied to a (k+1)th word line, and a negative voltage is applied to a (k+2)th word line to the nth word line.

11. The semiconductor memory device according to claim 9, wherein a voltage applied to the second semiconductor region is changed between the second verify operation and the first verify operation to change a voltage between the first semiconductor region and the second semiconductor region from the first voltage to the second voltage.

12. The semiconductor memory device according to claim 10, wherein a voltage applied to the second semiconductor region is changed between the second verify operation and the first verify operation to change a voltage between the first semiconductor region and the second semiconductor region from the first voltage to the second voltage.

13. The semiconductor memory device according to claim 9, wherein the first verify operation and the second verify operation are performed during a program operation aiming at writing the desired threshold voltage to the kth memory cell.

14. The semiconductor memory device according to claim 10, wherein the first verify operation and the second verify operation are performed during a program operation aiming at writing the desired threshold voltage to the kth memory cell.

15. The semiconductor memory device according to claim 11, wherein the first verify operation and the second verify operation are performed during a program operation aiming at writing the desired threshold voltage to the kth memory cell.

16. The semiconductor memory device according to claim 12, wherein the first verify operation and the second verify operation are performed during a program operation aiming at writing the desired threshold voltage to the kth memory cell.

* * * * *